(12) United States Patent
Nakamura

(10) Patent No.: US 6,873,669 B2
(45) Date of Patent: Mar. 29, 2005

(54) CLOCK SIGNAL REPRODUCTION DEVICE

(75) Inventor: Satoshi Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 618 days.

(21) Appl. No.: 09/876,586

(22) Filed: Jun. 7, 2001

(65) Prior Publication Data

US 2002/0037065 A1 Mar. 28, 2002

(30) Foreign Application Priority Data

Jun. 9, 2000 (JP) .................................... P2000-174575

(51) Int. Cl.[7] .............................................. H03D 3/24
(52) U.S. Cl. .................... 375/375; 375/376; 713/500
(58) Field of Search ............................. 375/376, 373, 375/374, 375; 713/500; 327/156, 147

(56) References Cited

U.S. PATENT DOCUMENTS 4,069,462 A * 1/1978 Dunn .......................... 331/11
5,528,198 A * 6/1996 Baba et al. ................. 331/1 A

FOREIGN PATENT DOCUMENTS

| EP | 000980163 A2 * | 2/2000 |
| JP | 63-249976 | 10/1988 |
| JP | 4-215338 | 8/1992 |
| JP | 10-163864 | 6/1998 |
| JP | 11-041222 | 2/1999 |
| JP | 2000-059213 | 2/2000 |
| KR | 2000-0017276 | 3/2000 |

* cited by examiner

Primary Examiner—Temesghen Ghebretinsae
(74) Attorney, Agent, or Firm—Scully, Scott Murphy & Presser

(57) ABSTRACT

A clock signal reproduction device is provided which comprises: a VCO 7 for generating a clock signal; a phase comparator 1 for comparing the phases of an input data signal and the clock signal and generating a first control signal; a phase/frequency comparator 2 for comparing the phases of a signal divided from the clock signal and a reference clock signal and generating a second control signal; a mode switching selector 5 for selecting the first control signal and the second control signal; an analog frequency synchronization-IN detecting circuit 9 for detecting whether a phase difference between the signal divided from the clock signal and the reference clock signal is within a predetermined range; and a digital frequency synchronization-OUT detecting circuit 11 for detecting whether a phase difference between the signal divided from the clock signal and the reference clock signal is outside of the predetermined range.

7 Claims, 35 Drawing Sheets

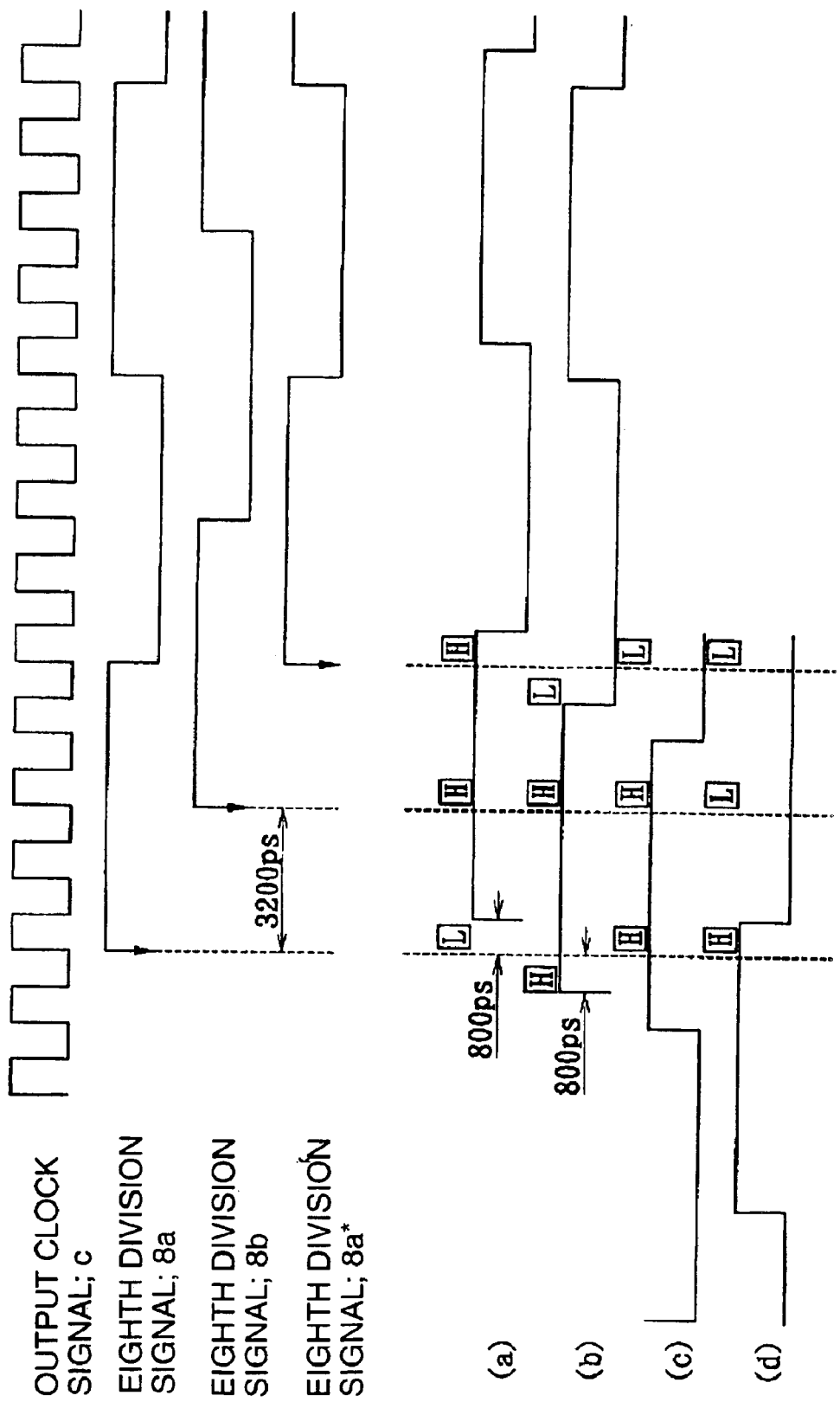

Fig. 20

| EIGHTH DIVISION SIGNAL 8a | EIGHTH DIVISION SIGNAL 8b | EIGHTH DIVISION SIGNAL 8a* | |
|---|---|---|---|
| H L | L L | H L | (5) ⎫ Out of phase synchronization or out of frequency synchronization (low) : × |
| L | L | L | (1) ← Phase following : ○ |
| L H | H H | H L | (2) (3) ← Immediately after synchronization : ○ |
| H | L | L | (4) ← Phase following : ○ |
| L H | L L | L H | (6) ⎫ Out of phase synchronization or out of frequency synchronization (low) : × |
| H | H | H | (7) ← Out of frequency synchronization (high) : × |

CLOCK SIGNAL REPRODUCTION DEVICE

BACKGROUND OF THE INVENTION

1. Field of the Invention

This invention relates to a clock signal reproduction device for reproducing a clock signal from an input digital signal.

2. Description of the Related Art

In a communication system such as a communication system, which uses digital signals, it is general to provide a clock signal reproduction device in order for a clock signal used for signal processing to be reproduced from an input signal received from another party, so that changes in the clock frequency of the input signal can always be followed.

FIG. 33 shows an example of a conventional clock signal reproduction device, and FIG. 34 shows the frequency characteristics of the clock signal reproduction device in this conventional example in an open loop condition. This clock signal reproduction device is disclosed in Japanese Unexamined Patent Application, First Publication, No. 63-249976 as a clock signal reproduction device.

The clock signal reproduction device of the above conventional example, shown in FIG. 33, comprises; a gate 101, a phase comparator 102, an adder 103, a loop filter 104, a VCO (Voltage Controlled Oscillator) 105, a frequency divider 106, and a frequency comparator 107.

Using a drop out signal, the gate 101 blocks an input digital data signal. The phase comparator 102 produces an output corresponding to the phase difference between the digital signal from the gate 101 and the clock signal from the frequency divider 106.

The frequency comparator 107 generates an output corresponding to the frequency difference between the reference signal and the clock signal. The adder 103 adds the output from the phase comparator 102 and the output from the frequency comparator 107. The loop filter 104, as shown in FIG. 34(a), has flat frequency characteristics between frequency f111 and frequency f112, and generates a voltage corresponding to the addition result from the adder 103 to be output to the VCO 105.

The whole clock signal reproduction device has the frequency characteristics as shown in FIG. 34(b) in an open loop condition, and generates a signal of a frequency corresponding to the output voltage from the loop filter 104. The frequency divider 106 divides the signal generated by VCO 105 to produce a clock signal.

Next is a description of the operation of the clock signal reproduction device shown in FIG. 33. In the phase comparator 102, an output corresponding to the phase difference between the input digital signal and the clock signal is generated, and also in the frequency comparator 107 an output corresponding to the frequency difference between the clock signal and the reference signal is generated. Then in the adder 103, the output of the phase comparator 102 and the output of the frequency comparator are added. The bandwidth of the voltage signal of he addition result is limited by the loop filter 104, the obtained voltage being applied to the VCO 105, and thus the signal generated by the VCO 105 is divided by the frequency divider 106 to produce a clock signal. Therefore, according to the clock signal reproduction device shown in FIG. 33, depending on the dominant output of either the phase comparison result between the input digital signal and the clock signal, or the frequency comparison result between the clock signal and the reference signal, the operation is performed in either phase comparison mode or frequency comparison mode, and hence it is possible to generate a clock signal that is synchronized to the input digital signal or the reference signal.

However, with the clock signal reproduction device of the conventional example shown in FIG. 33, since the adder 103 comprises an analog circuit, if the linearity of the adder 103 is poor then it affects the addition result. Therefore, it is not possible to obtain an addition result that reliably corresponds to the output based on the phase difference from the phase comparator 102 and the output based on the frequency difference from the frequency comparator 107, and hence a clock signal of a frequency corresponding to the input digital signal cannot be reproduced.

Furthermore, since the adder 103 comprises an analog circuit, there is a possibility that dispersion in the operation and the like occurs due to manufacturing faults. Therefore, a consistent clock signal reproduction device cannot be realized.

Moreover, with the clock signal reproduction device of this conventional example, during the operation in phase comparison mode the output of the frequency comparison result may cause external interference and prevent normal operation.

In this respect, a clock signal reproduction device is proposed wherein such problems are solved by separating the phase comparison mode system and the frequency comparison mode system completely.

FIG. 35 shows another example of a conventional clock signal reproduction device, which is disclosed as an asynchronous data demodulation circuit in Japanese Unexamined Patent Application, First Publication No. 11-41222.

In the clock signal reproduction device of this conventional example, as shown in FIG. 35, the construction comprises; a phase comparison section 201, a phase/frequency comparison section 202, a selection section 203, a loop filter 204, a VCO 205, a frequency detecting section 206, and a timer 207.

The clock signal reproduction device in FIG. 35 does not have an analog adder circuit, so that such problems as lack of consistency due to manufacturing faults as in the conventional example in FIG. 33 have been solved.

By comparing the phases of the input data signal and the output clock signal, the phase comparison section 201 generates an UP signal for increasing the frequency of the output clock signal, or a DN signal for reducing it. By comparing the frequencies of the output clock signal and the reference clock signal, the phase/frequency comparison section 202 generates an UP signal for increasing the frequency of the output clock signal, or a DN signal for reducing it. The selection section 203 selects the output of the phase comparison section 201 or the phase/frequency comparison section 202 and outputs the UP signal or the DN signal as the selection result. The loop filter 204 contains a charge pump circuit, which supplies a signal obtained by direct current reproduction or bandwith limiting of the input signal to the VCO 205. The VCO 205 signal oscillates at a frequency corresponding to the output voltage of the loop filter 204. The frequency detecting section 206 calculates the frequencies of the output clock signal and the reference clock signal each time a system reset signal is input, and when the difference between the calculated results exceeds a predetermined value, it generates an output signal Eo. The timer 207 is driven by the presence of the signal Eo, and outputs a signal that is significant during a certain operation period.

The selection section 203 selects the output of the phase/frequency comparator 202 during the period that the output of the timer 207 is present, and selects the output of the phase comparison section 201 during the other period.

Next is a description of the operation of the clock signal reproduction device shown in FIG. 35. In the condition where synchronization of the output signal of the VCO 205 to the frequency of the input data signal is established, the frequency detecting section 206 does not generate an output. Accordingly, the timer 107 is in an inactive condition, and the selection section 203 selects the output of the phase comparison section 201. In this condition, the clock signal reproduction device performs a PLL (Phase Locked Loop) operation in phase comparison mode between the input data signal and the output clock signal to control such that the output clock signal frequency follows the input data signal.

On the other hand, in the condition where the output clock signal of the VCO 205 is out of synchronization to the input data signal frequency, the timer 207 operates by the presence of the output signal Eo from the frequency detecting section 206, and the selection section 203 selects the output of the phase/frequency comparison section 202 during the timer operating period. In this condition, the clock signal reproduction device operates as a PLL in phase/frequency comparison mode between the reference clock signal and the output clock signal to control the synchronization of the output clock signal frequency to the reference clock signal. In this case, by selecting a time To that is necessary and sufficient to establish synchronization for the operating period, since the clock signal reproduction device is in synchronization with the reference clock signal when the operating time To is over, it is possible to operate in synchronization with the input data signal immediately after the selection section 203 reselects the output of the phase comparison section 201.

However, with respect to the clock signal reproduction device of the conventional example shown in FIG. 35, there is a problem in that jitter tolerance, being the range in which the clock signal generation operation can continue to follow variations in the frequency of the input data signal, is low.

This is because of the case where if the phase of the input data signal changes gradually after the phases of the input data signal and the output data signal are synchronized, it is preferable not to judge it to be out of synchronization, but to follow it continuously. However, since the size of the predetermined phase difference when switching from phase comparison mode to phase frequency comparison mode and the size of the predetermined phase difference when switching back are the same, the two predetermined phase differences must be set to the same value to compensate for a predetermined phase difference when operating such that the phase difference is as small as possible.

Furthermore, in this conventional example, there is a problem in that before returning to phase comparison mode at the time of an out of synchronization condition, there is a possibility of wasted time.

This is because of the case where since the time to return to phase comparison mode is set to a predetermined time that is fixed by the timer 207, even when synchronization is established early, it must wait until the timer period is completed, and hence there is wasted time.

SUMMARY OF THE INVENTION

This invention was made to solve the above problems and the object of the present invention is to provide a clock signal reproduction device, wherein the phase comparison mode system and the phase frequency comparison mode system are separated. Furthermore, detecting whether synchronization is achieved by testing whether the phase difference is less than or equal to a predetermined phase difference in the phase frequency comparison mode is stricter than detecting whether it is out of synchronization in the phase comparison mode. That is, a clock signal reproduction system is provided, in which, a useless time can be eliminated by setting a smaller predetermined phase difference, in the case where the phase or frequency of the input data signal changes, synchronization can be achieved by adjusting the phase of the output clock signal accurately, and also jitter tolerance can be increased.

In order to solve the abovementioned problems, the first aspect of the present invention is related to a clock signal reproduction device in which there is provided: an oscillation device for generating a clock signal of a frequency corresponding to a control signal input; a first comparison device for comparing the phases of an input data signal and the clock signal and generating a first control signal for correcting a phase difference between the two signals; a second comparison device for comparing the phases of a signal divided from the clock signal and a reference signal and generating a second control signal for correcting a frequency discrepancy of the clock signal; a switching device for selecting either the first control signal or second control signal and outputing a control signal for applying to the oscillation device; and a control device for controlling such that the switching device selects the first control signal depending on a detection signal from a first detecting device for detecting whether a phase difference between the divided signal of the clock signal and the reference signal is within a first predetermined range, and also for controlling such that the switching device selects the second control signal depending on a detection signal from a second detecting device for detecting whether a phase difference between the signal divided from the clock signal and the reference signal is outside of a second predetermined range that is wider than the first predetermined range.

The second aspect of the present invention is related to a clock signal reproduction device according to the first aspect, wherein the second detecting device generates a detection signal when it is determined that a condition of edges existing in a plurality of signals that are divided from the clock signal, each having phases differing in half periods of the reference signal, is not a predetermined condition.

The third aspect of the present invention is related to a clock signal reproduction device according to the second aspect, wherein the plurality of signals with different phases in the second detecting device, which are divided from the clock signal, comprising signals divided from the clock signal, one of which is a signal divided from the clock signal whose phase is shifted by 90 degrees, and another is a signal divided from the clock signal whose phase is shifted by 180 degrees.

The fourth aspect of the invention is related to a clock signal reproduction device according to the first aspect, wherein the signals divided from the clock signal are signals dividing the clock signal by n.

Furthermore a fifth aspect of the invention is related to a clock signal reproduction device according to the first aspect, wherein the first detecting device is provided with a multistage counting device for counting the reference signal, and a latching device that sets when the counting device finishes counting, and resets when the phase difference between a signal divided from the clock signal and the reference signal is within a predetermined range, and generates the detection signal in response to the output conditions at the time that the latching device is reset.

A sixth aspect of the invention is related to a clock signal reproduction device according to the first aspect, wherein the oscillation device incorporates a filtering device for removing high frequency components of the control signal input, and a voltage controlled oscillation device for generating a clock signal at a frequency depending on the output voltage of the filtering device.

Furthermore, a seventh aspect of the invention is related to a clock signal reproduction device according to the first aspect, wherein the first detecting device comprises an analog circuit, and the second detecting device comprises a digital circuit.

In the construction of this invention, based on the result of comparing the phases of the signal divided from the clock signal and the reference signal from the second comparison device, the second control signal for correcting the frequency discrepancy of the clock signal is applied to the oscillation device, and by generating a clock signal of a frequency corresponding to this control signal it operates as a multiplication PLL system.

During operation as a multiplication PLL system, when the first detecting device detects that the phase difference between the signal divided from the clock signal and the reference signal falls within a first predetermined range, the switching device is operated, and based on the result of comparing the phases of the input data signal and the clock signal from the first comparison device, the first control signal for correcting the frequency difference of the two signals is applied to the oscillation device, and by generating a clock signal of a frequency corresponding to this control signal it operates as a clock recovery system.

Then, during operation as a clock recovery system, when the second detecting device detects that the phase difference between the signal divided from the clock signal and the reference signal falls within a second predetermined range, the switching device is operated, and the second control signal is applied to the oscillation device to operate as a multiplication PLL system.

With this invention, since the range of phase difference that the second detecting device can accept as being outside of the second predetermined range is wide, clock recovery operation can continue for a considerable range of change of the input data signal frequency, and hence the requirement of a wide jitter tolerance range can be satisfied.

BRIEF DESCRIPTION OF THE DRAWINGS

FIG. 19 is a waveform diagram (2) to explain the operation of the digital frequency synchronization-OUT detecting circuit of the embodiment.

FIG. 20 shows an out of frequency synchronization detection truth table of the digital frequency synchronization-OUT detecting circuit of the embodiment.

DESCRIPTION OF THE PREFERRED EMBODIMENTS

Hereinafter, a description is provided about an embodiment of this invention with reference to drawings. The explanation is provided by describing the preferable embodiment.

Figure 1:
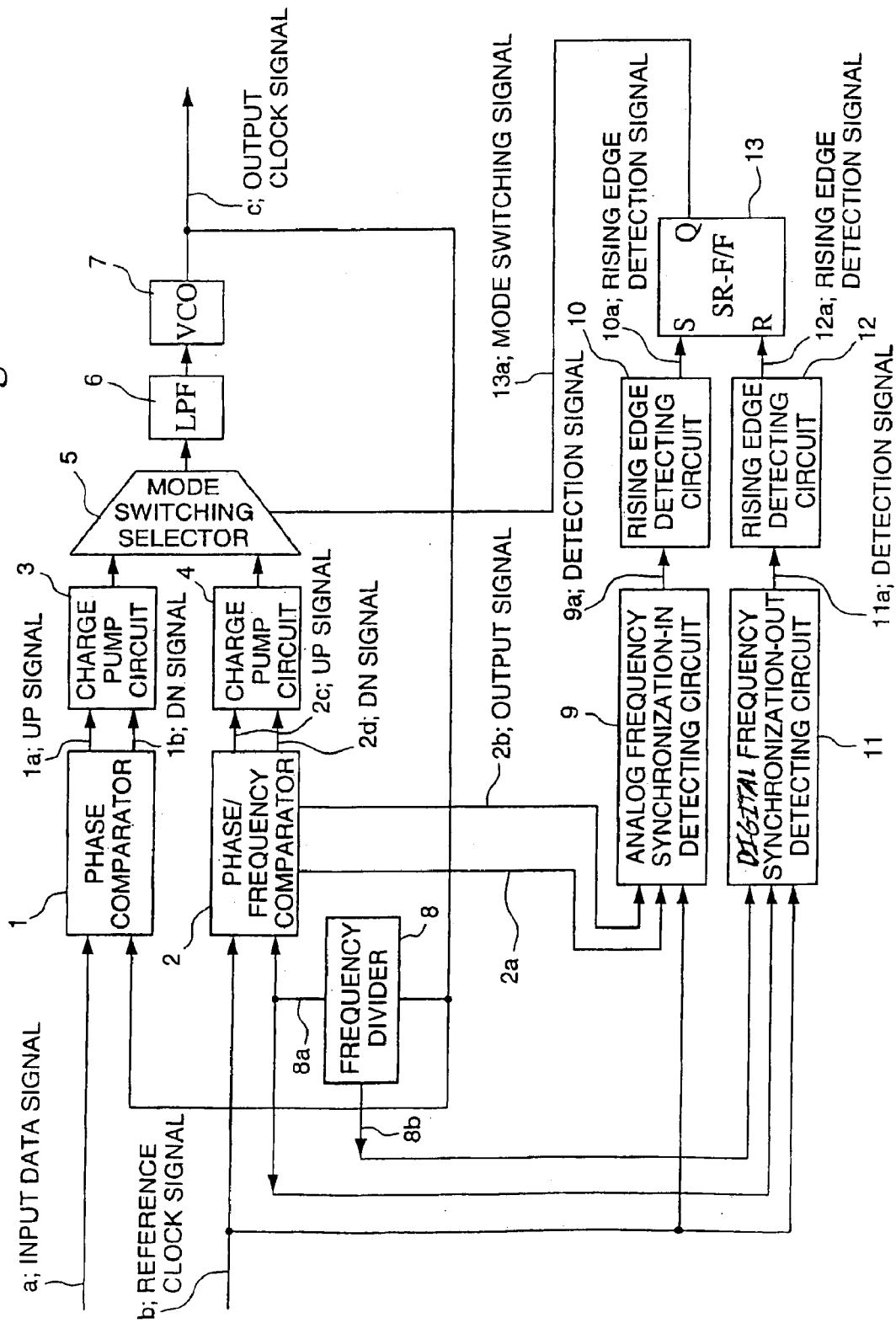
FIG. 1 is a circuit diagram showing a structure of the clock signal reproduction device being an embodiment of this invention.
Figure 2:
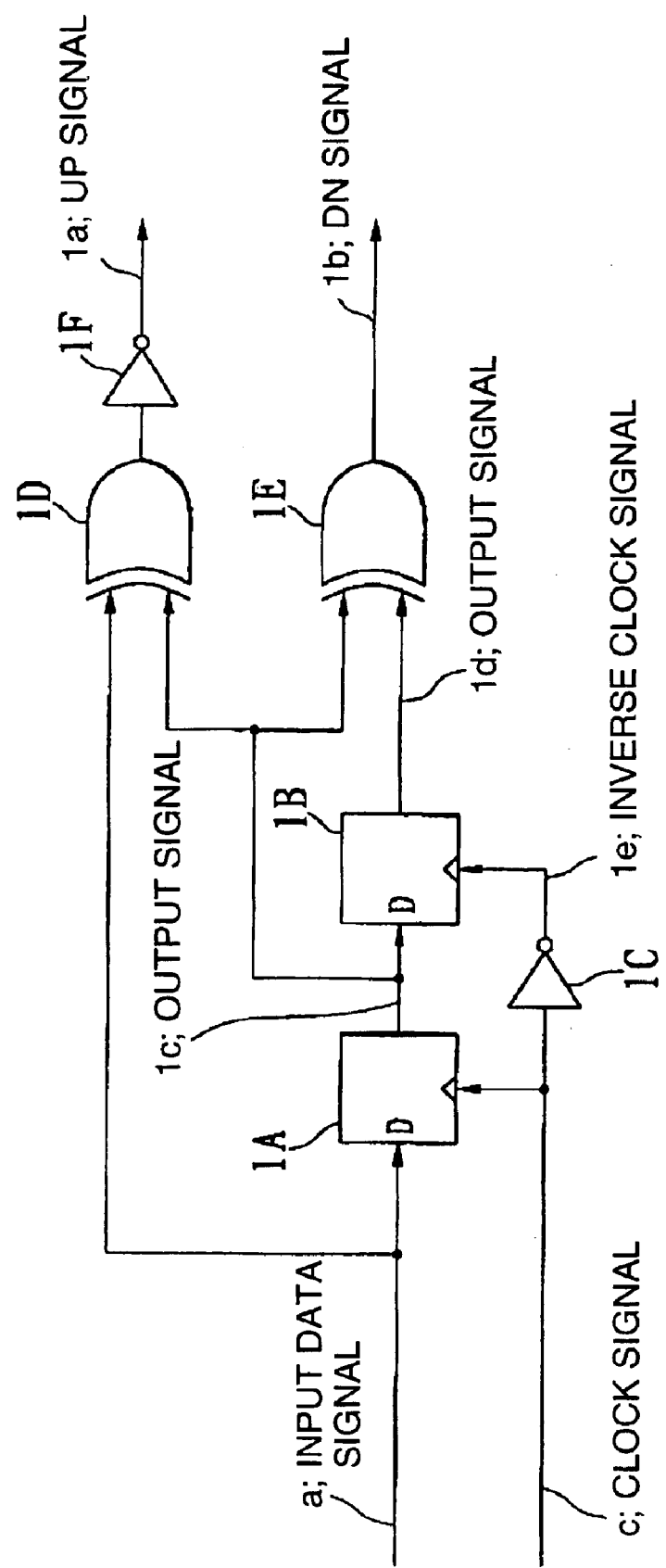
FIG. 2 is a block diagram showing a structural example of a phase comparator of the embodiment.
Figure 3:
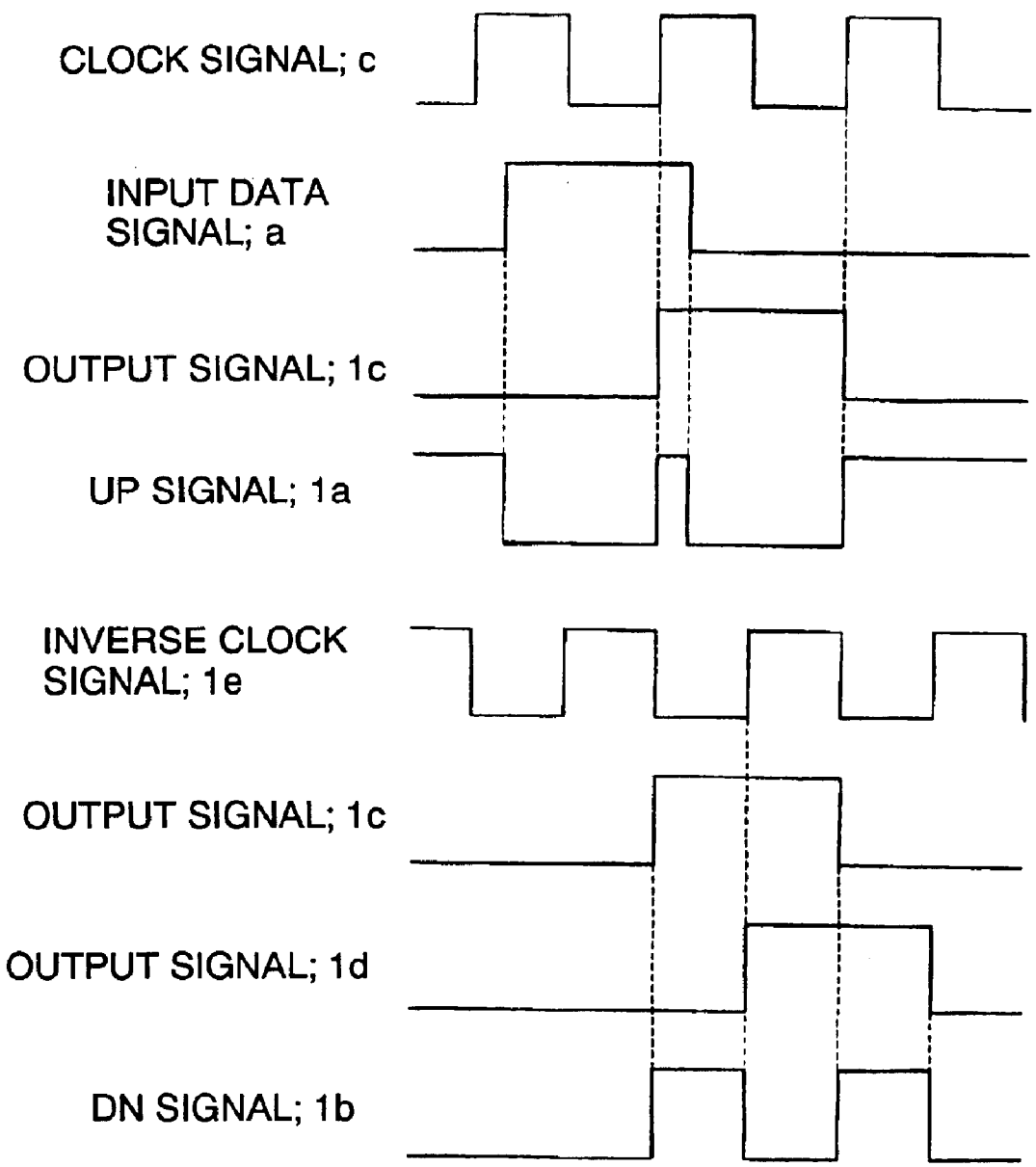
FIG. 3 is a waveform diagram (1) to explain the operation of the phase comparator of the embodiment.
Figure 4:
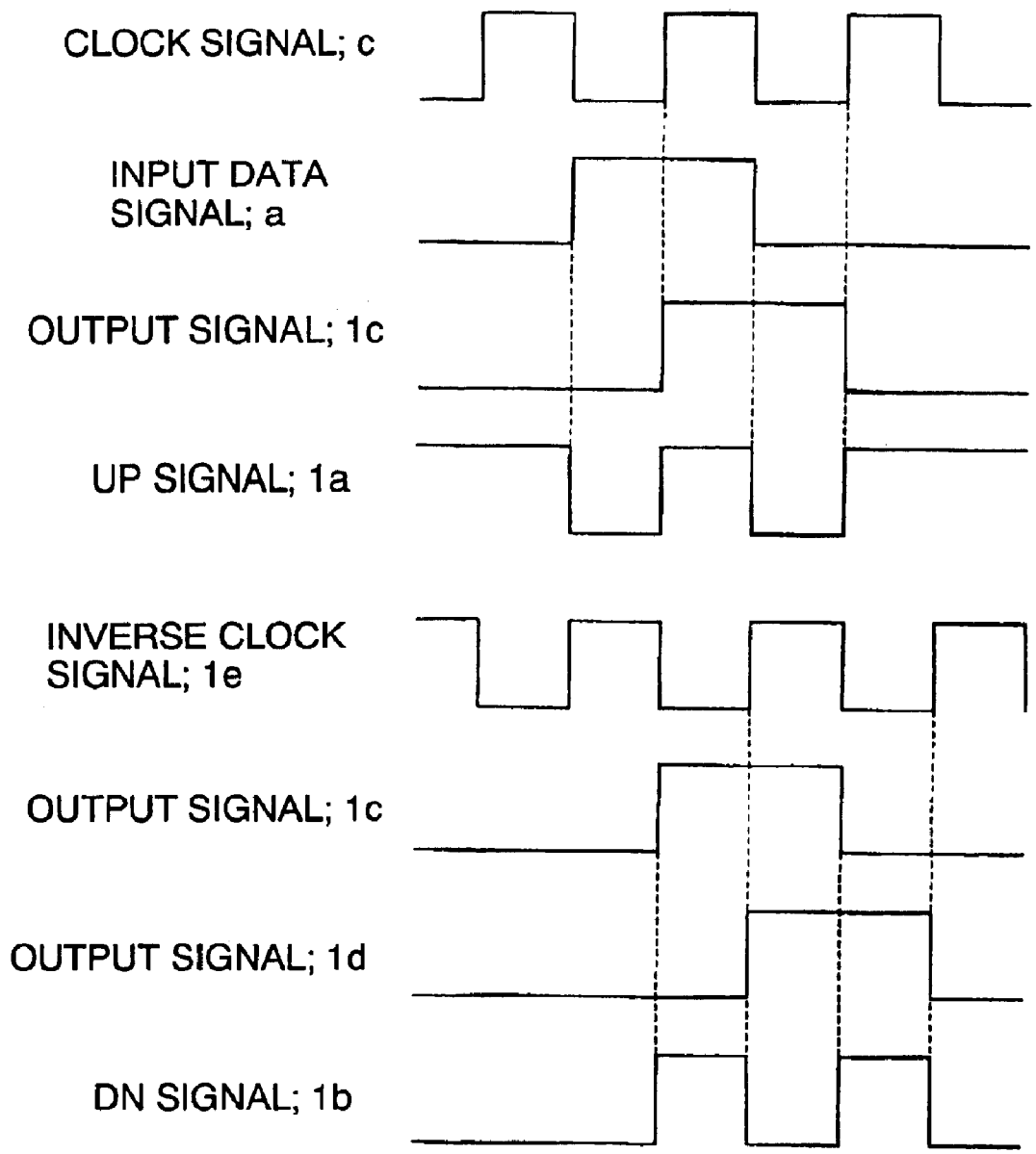
FIG. 4 is a waveform diagram (2) to explain the operation of the phase comparator of the embodiment.
Figure 5:
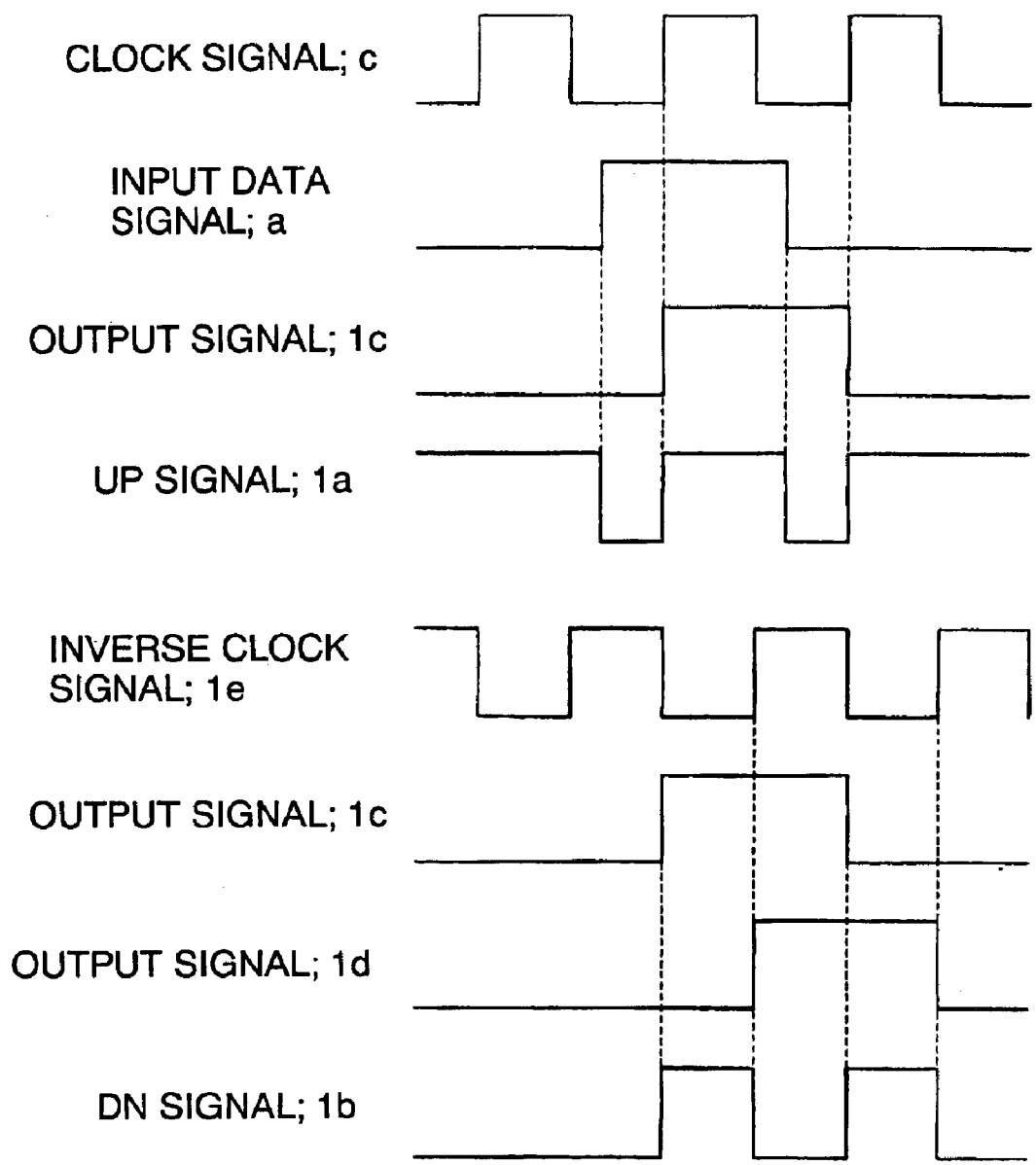
FIG. 5 is a waveform diagram (3) to explain the operation of the phase comparator of the embodiment.
Figure 6:
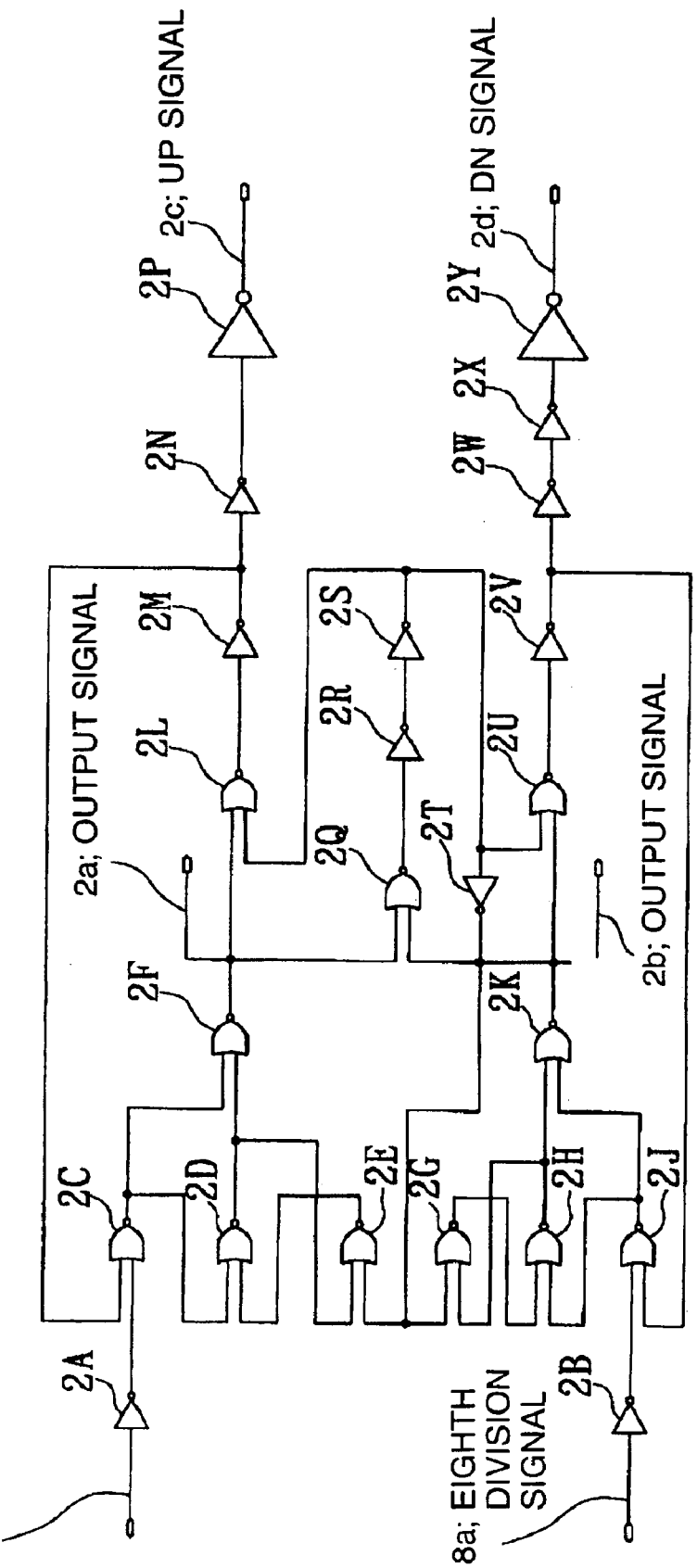
FIG. 6 is a circuit diagram showing a structural example of a phase/frequency comparator of the embodiment.
Figure 7:
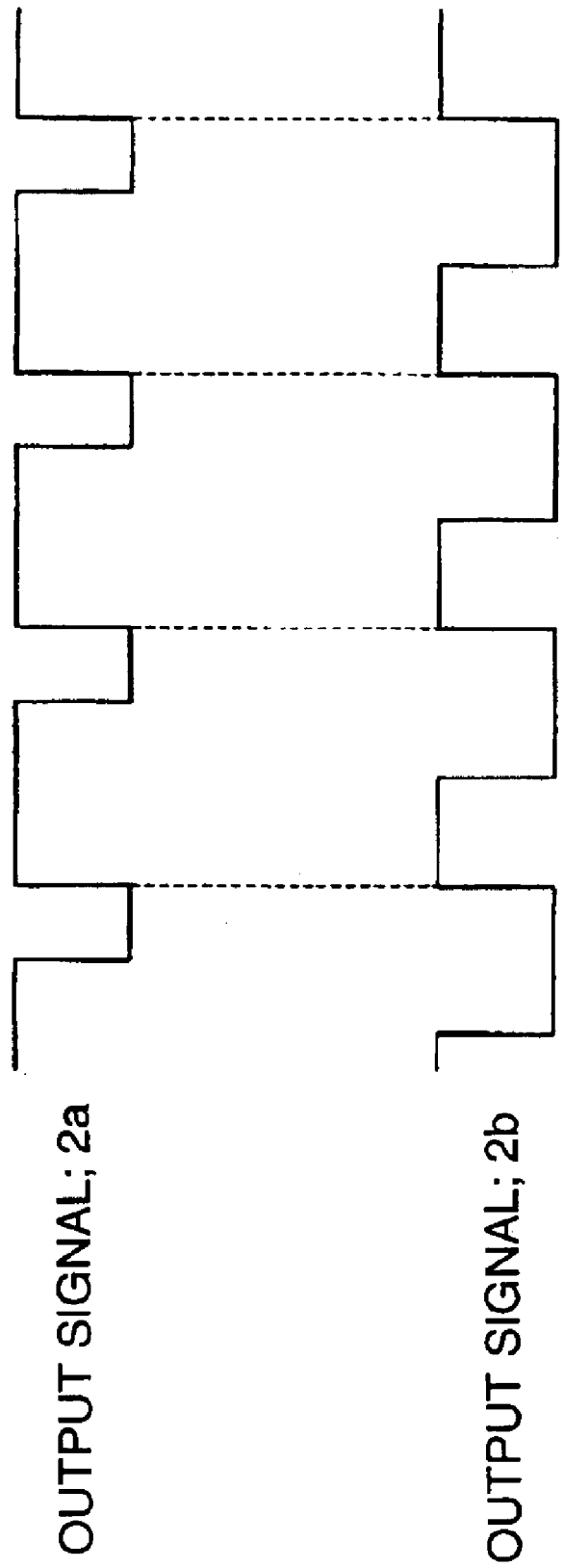
FIG. 7 is a waveform diagram showing waveforms of the output of the phase/frequency comparator of the embodiment.
Figure 8:
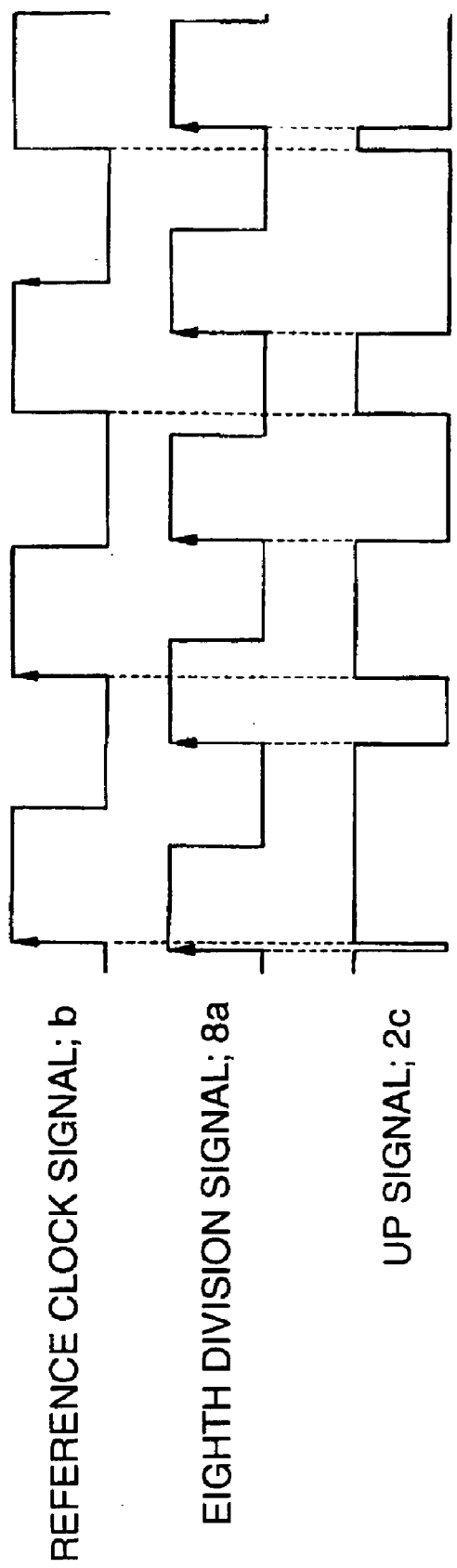
FIG. 8 is a waveform diagram showing a waveform of an UP signal that the phase/frequency comparator of the embodiment outputs.
Figure 9:
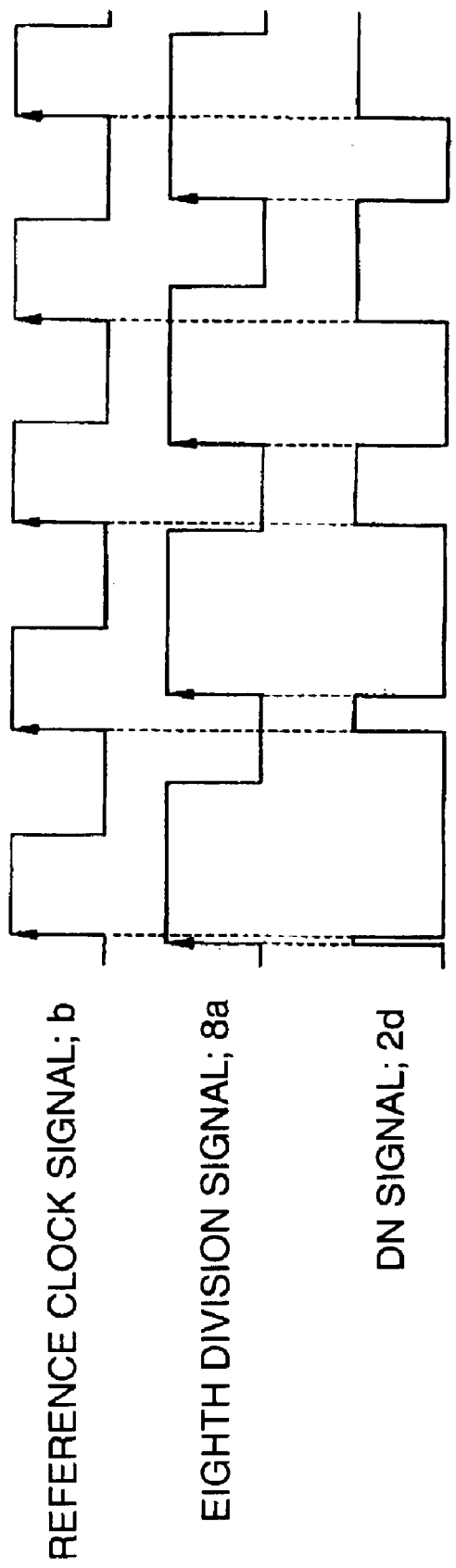
FIG. 9 is a waveform diagram showing a waveform of a DN signal that the phase/frequency comparator of the embodiment outputs.
Figure 10:
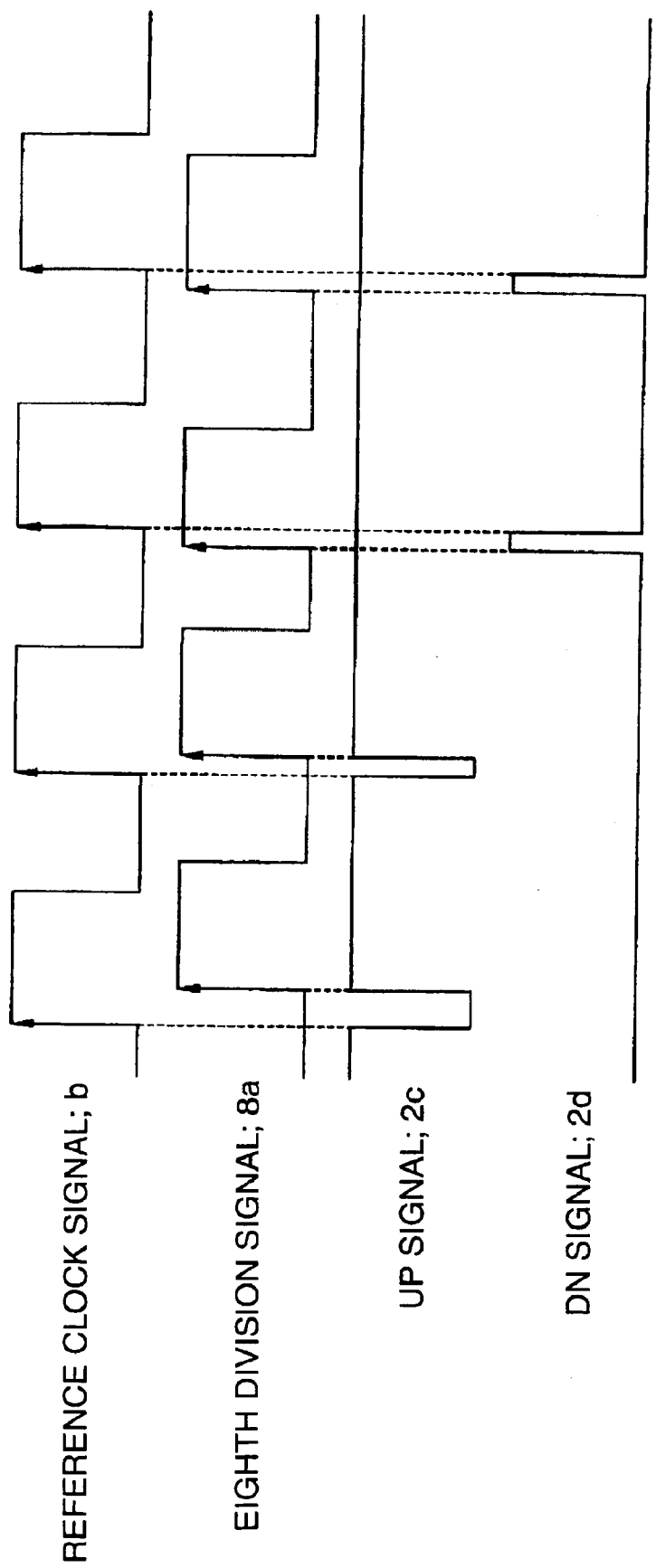
FIG. 10 is a waveform diagram showing a waveform of the UP signal and the DN signal that the phase/frequency comparator of the embodiment outputs.
Figure 11:
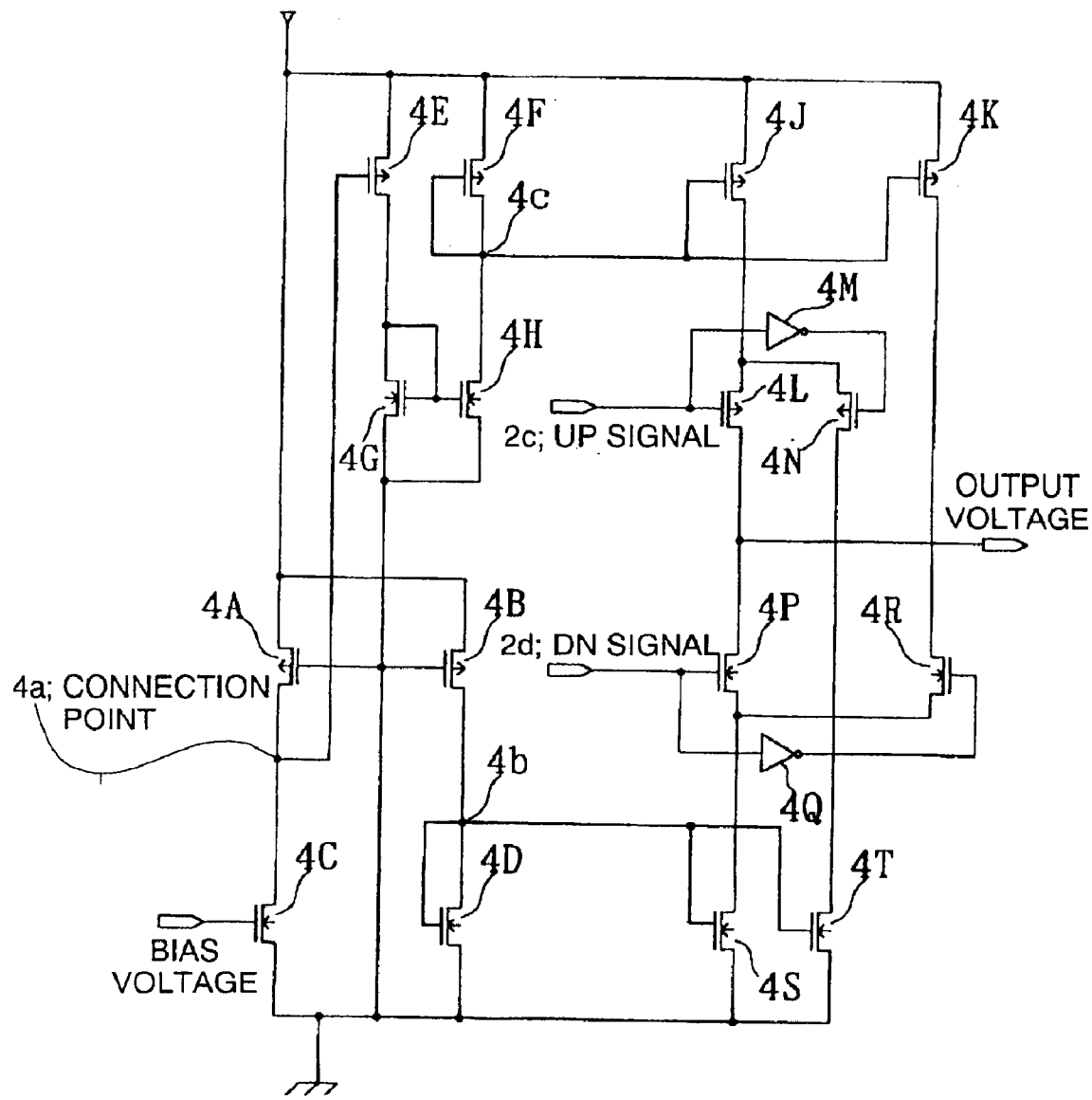
FIG. 11 is a circuit diagram showing a structural example of a charge pump circuit of the embodiment.
Figure 12:
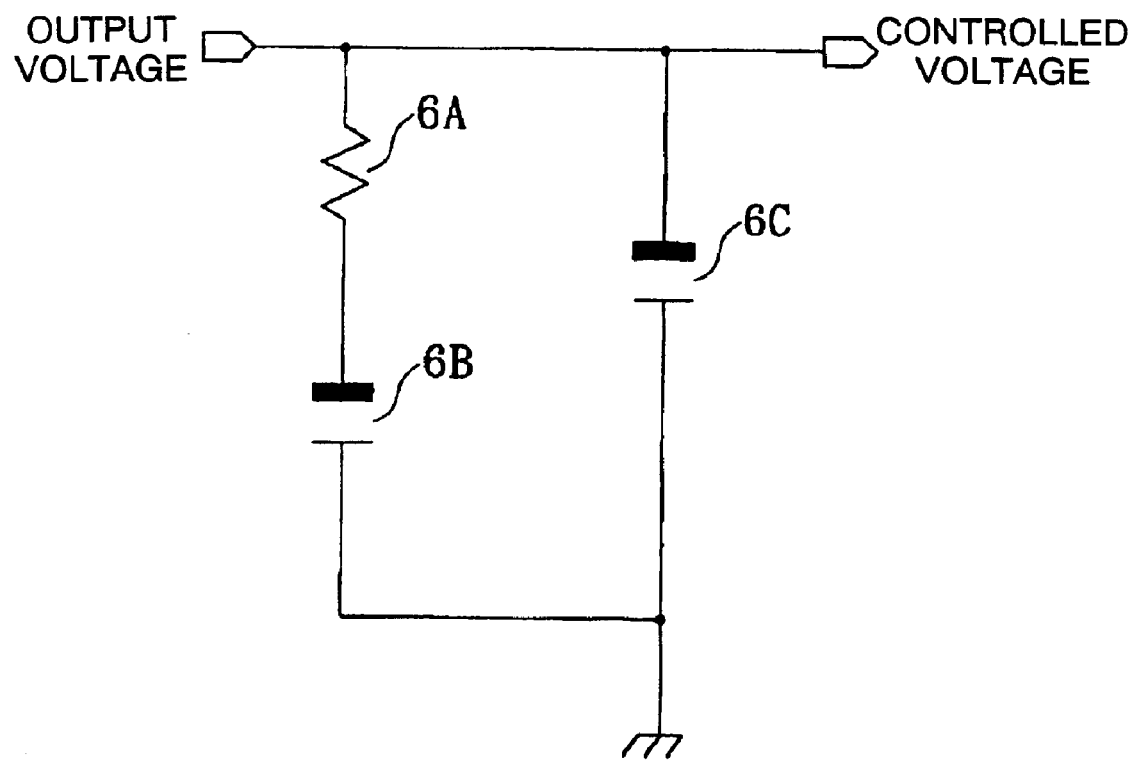
FIG. 12 is a circuit diagram showing a structural example of an LPF of the embodiment.
Figure 13:
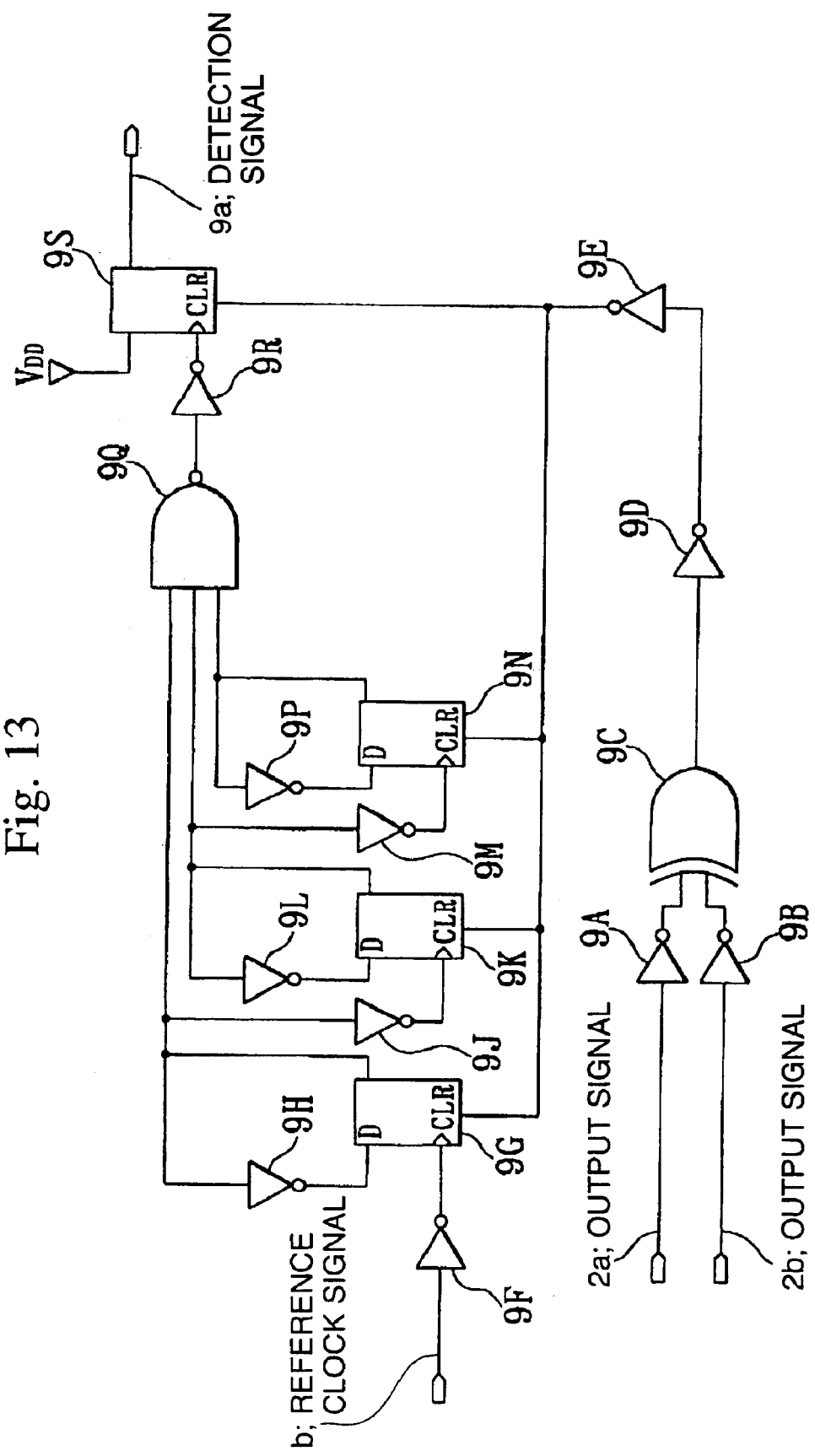
FIG. 13 is a circuit diagram showing a structural example of an analog frequency synchronization-IN detecting circuit of the embodiment.
Figure 14:
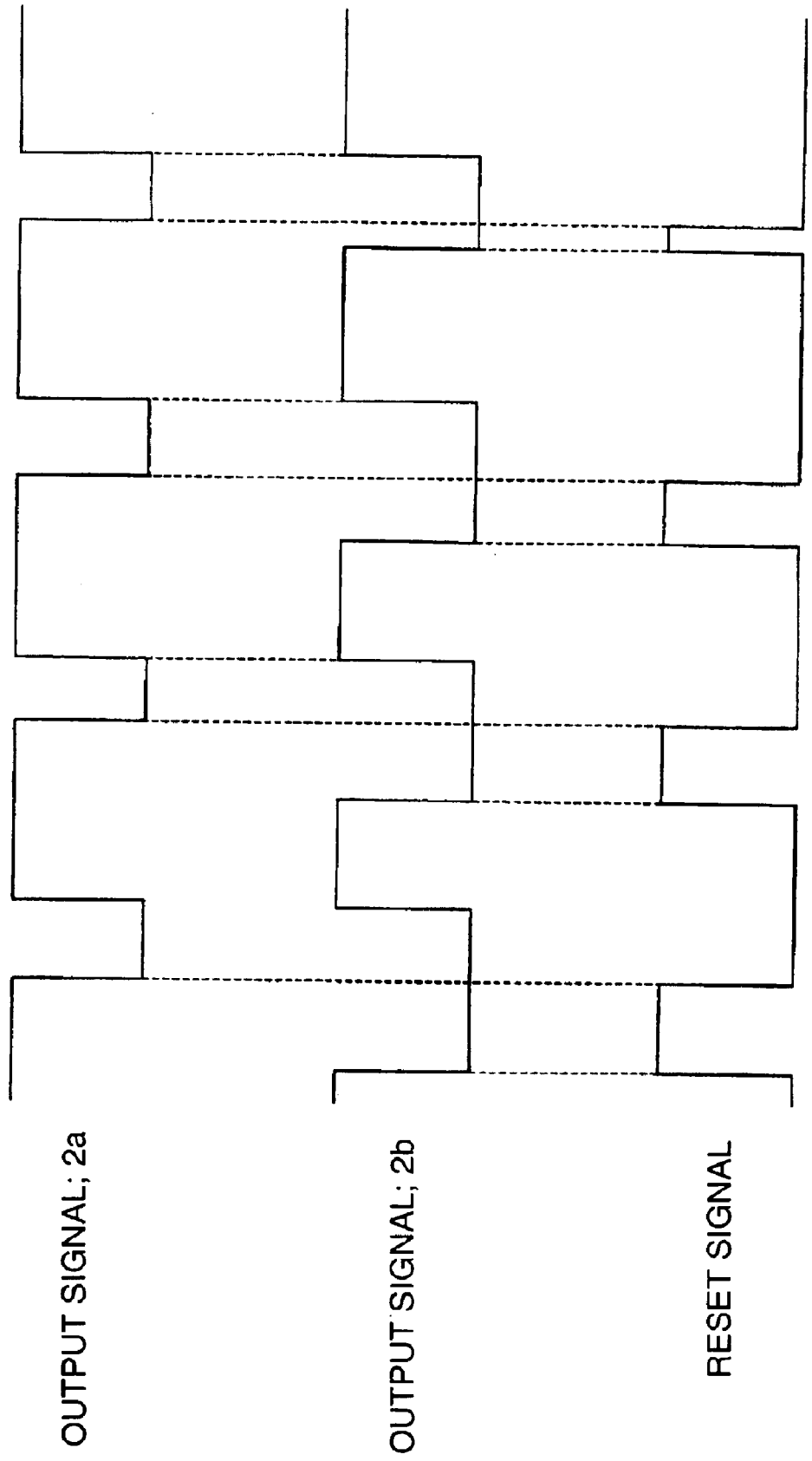
FIG. 14 is a waveform diagram to explain the operation of the analog frequency synchronization-IN detecting circuit of the embodiment.
Figure 15:
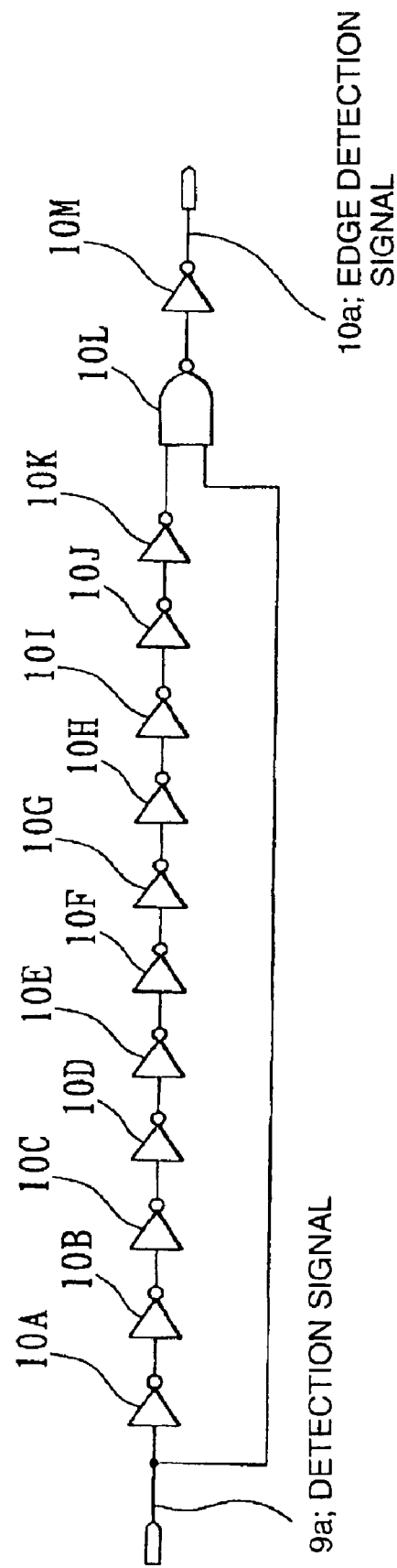
FIG. 15 is a circuit diagram showing a structural example of a rising edge detecting circuit of the embodiment.
Figure 16:
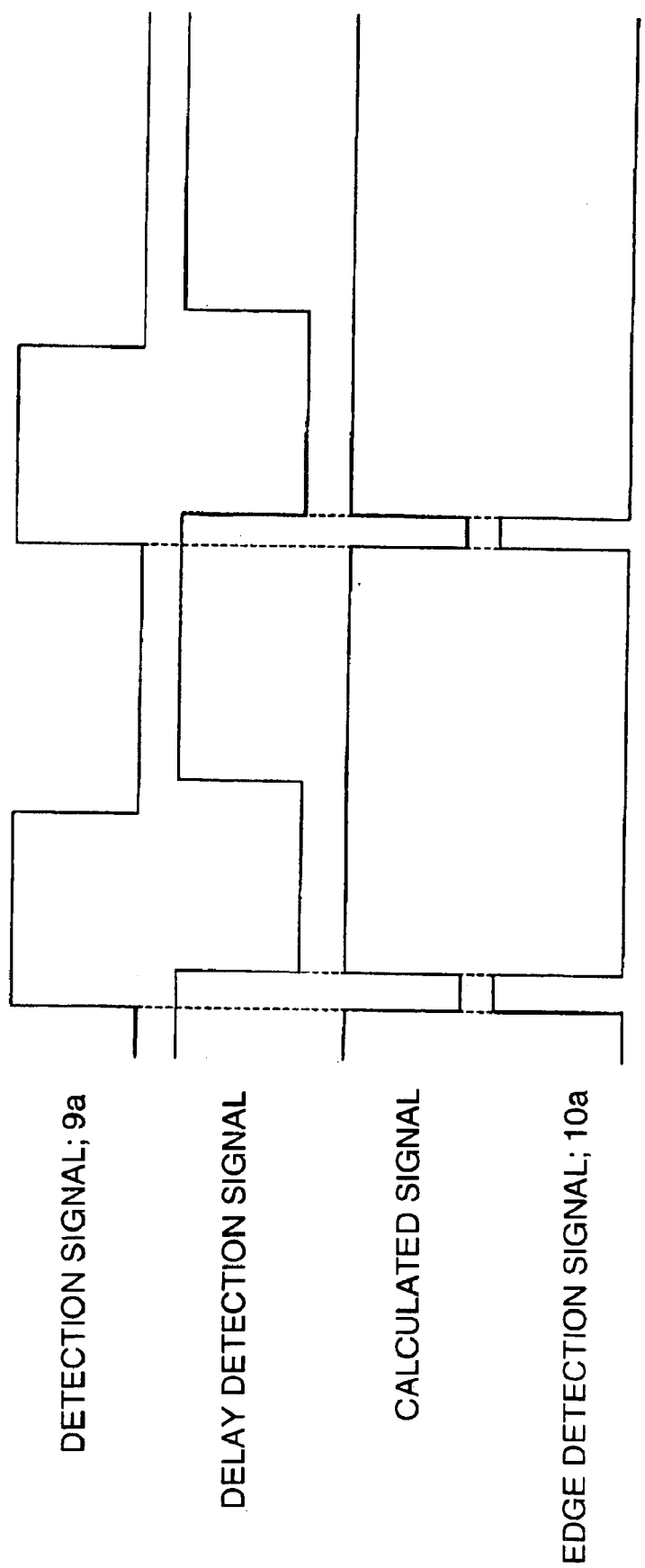
FIG. 16 is a waveform diagram to explain the operation of the rising edge detecting circuit of the embodiment.
Figure 17:
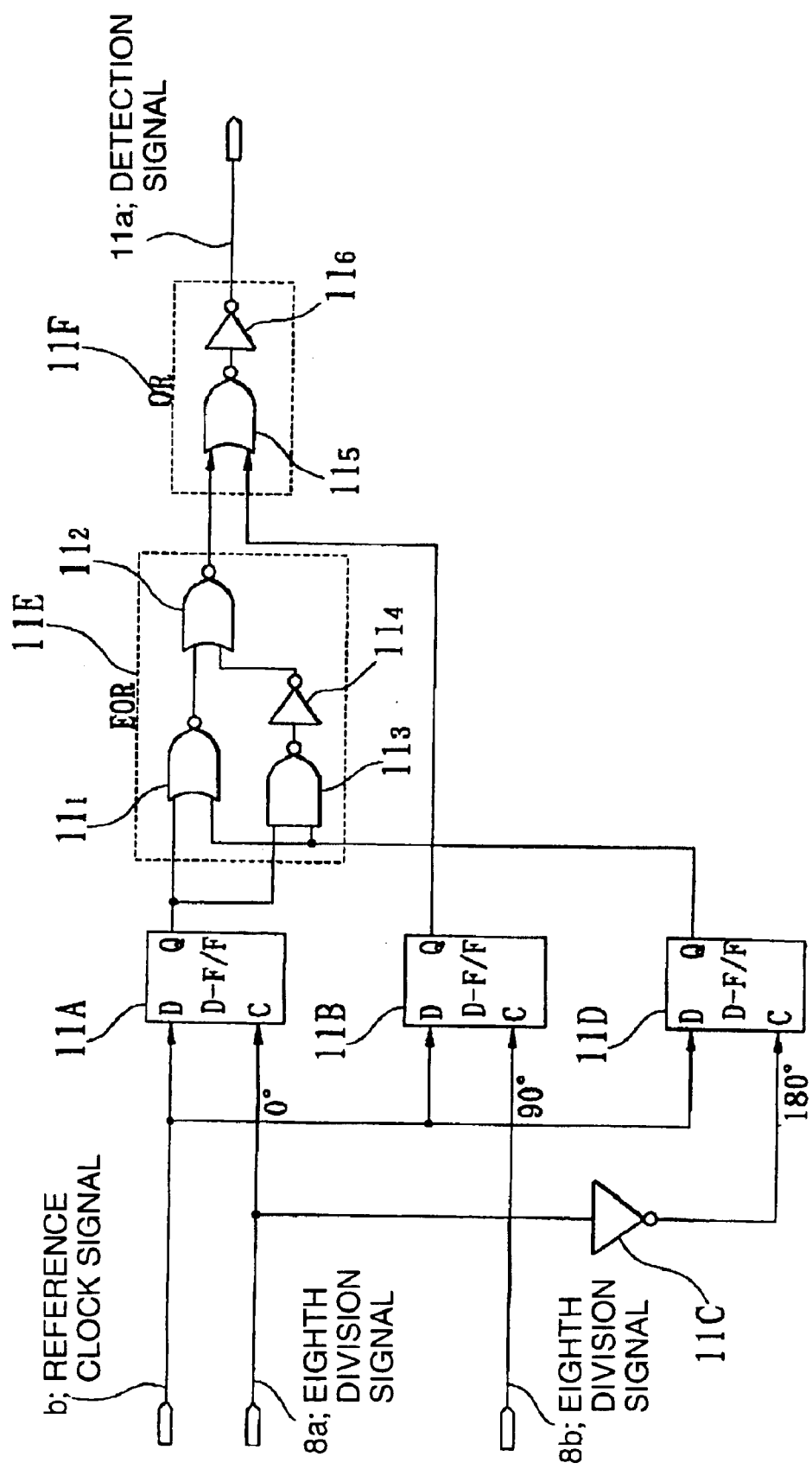
FIG. 17 is a circuit diagram showing a structural example of a digital frequency synchronization-OUT detecting circuit of the embodiment.
Figure 18:
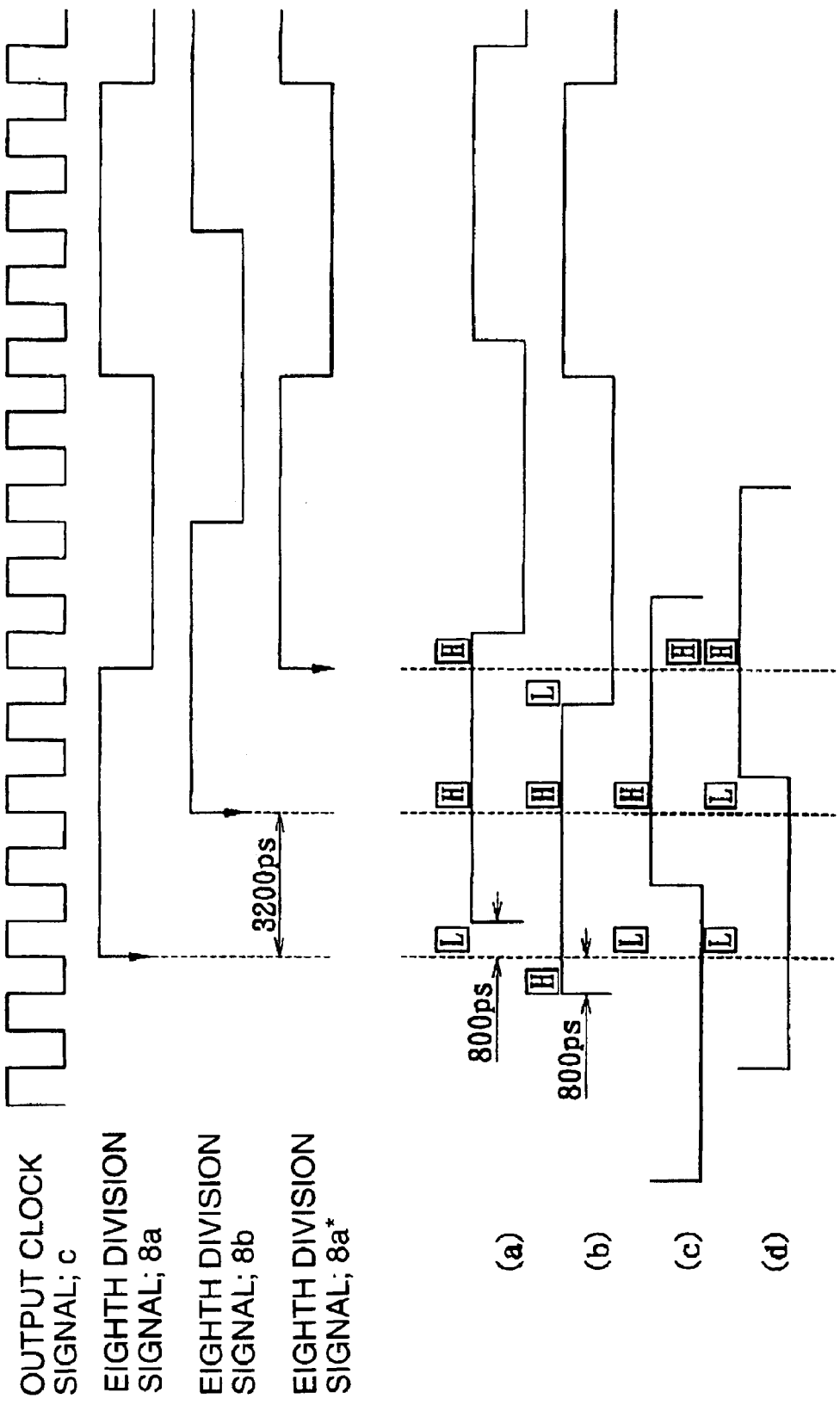
FIG. 18 is a waveform diagram (1) to explain the operation of the digital frequency synchronization-OUT detecting circuit of the embodiment.
Figure 21:
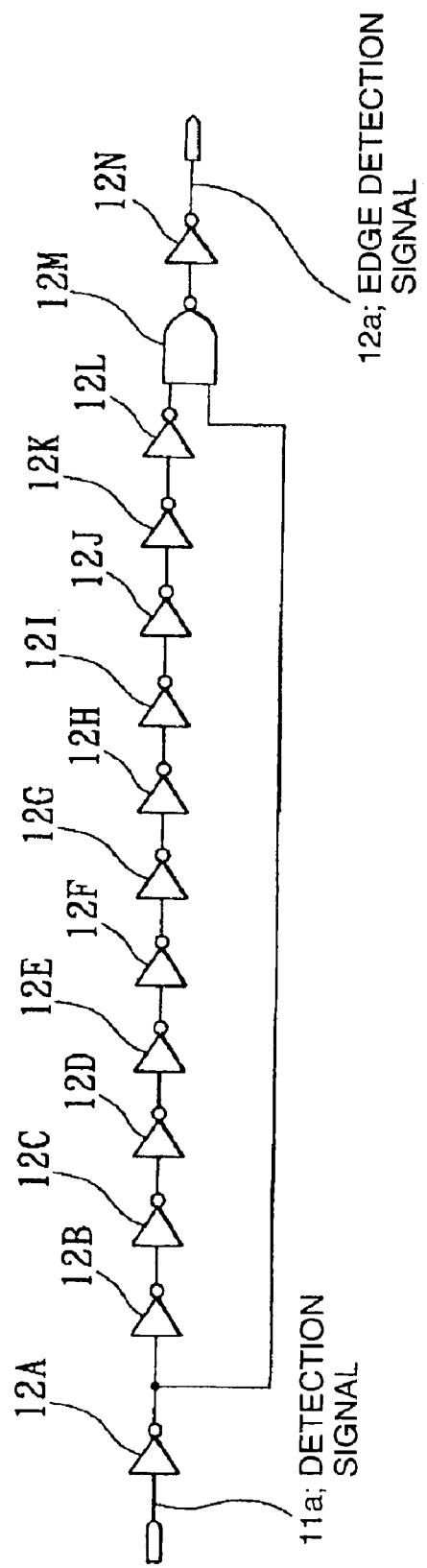
FIG. 21 is a circuit diagram showing a structural example of a rising edge detecting circuit of the embodiment.
Figure 22:
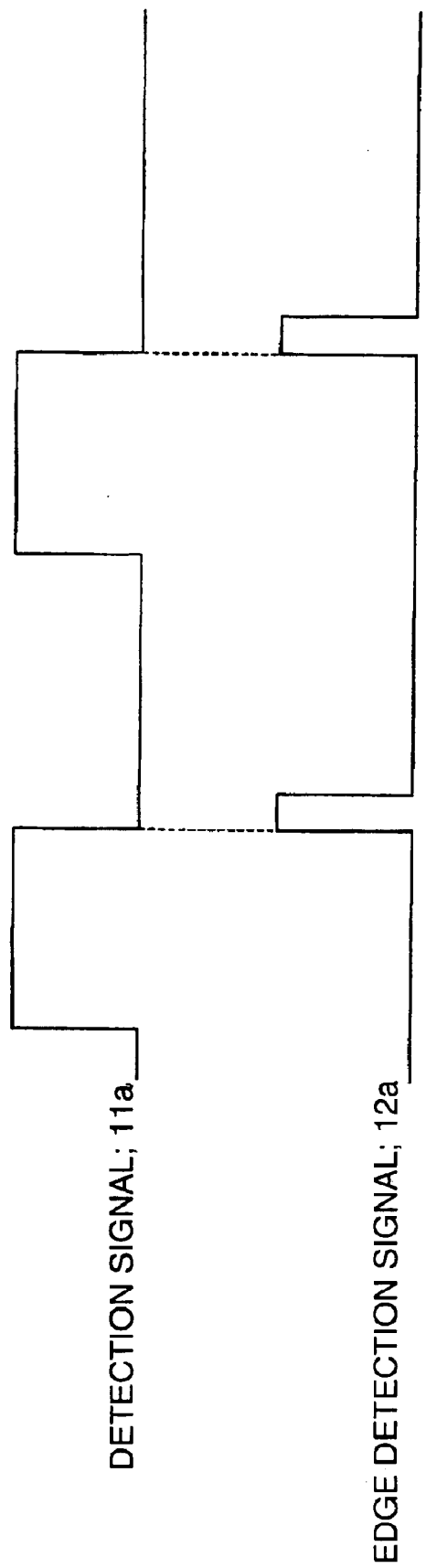
FIG. 22 is a waveform diagram to explain the operation of the rising edge detecting circuit of the embodiment.
Figure 23:
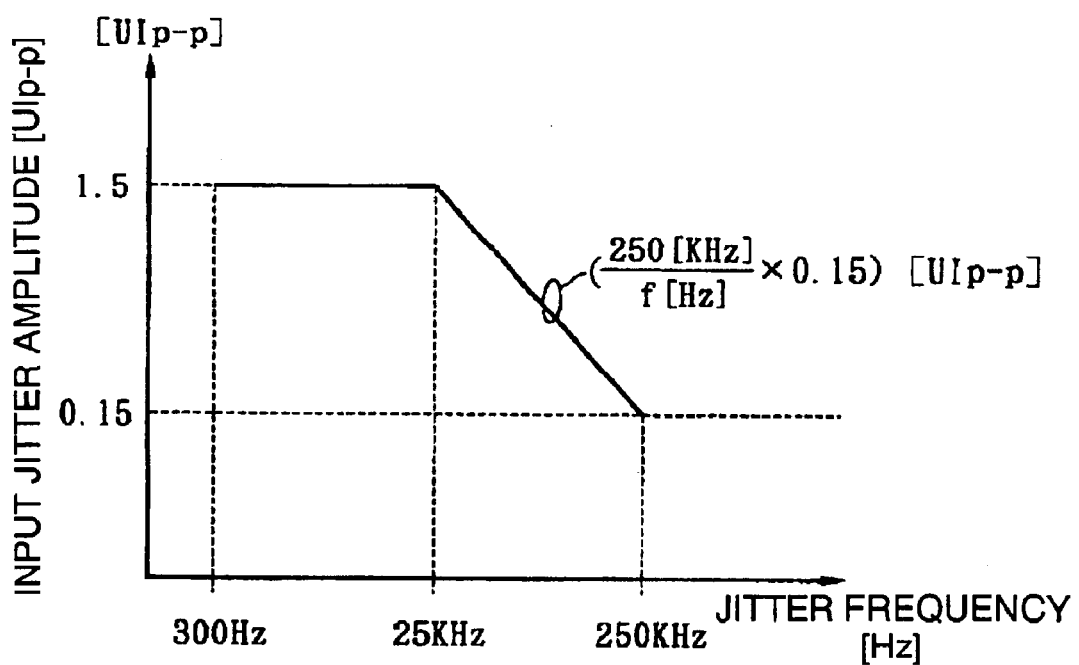
FIG. 23 shows an example of jitter tolerance.
Figure 24:
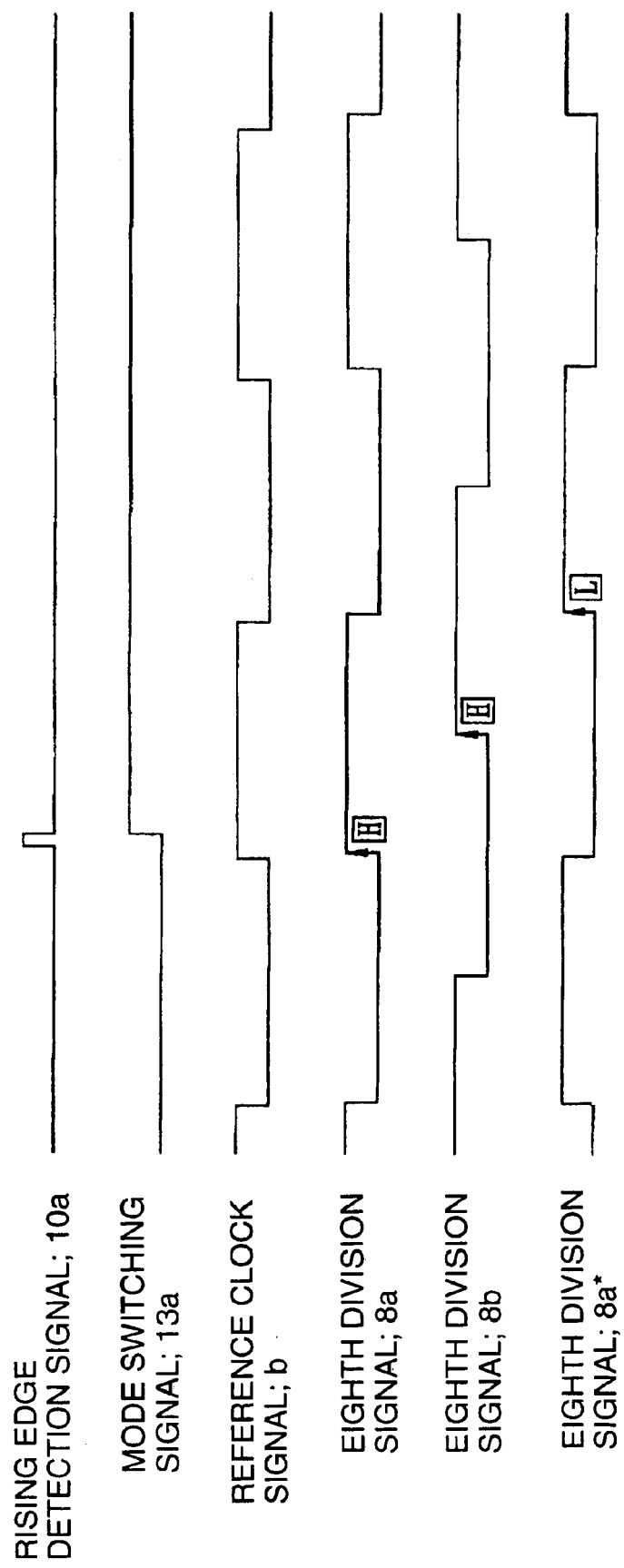
FIG. 24 is a waveform diagram (1) to explain the operation of the out of frequency synchronization detection of the embodiment.
Figure 25:
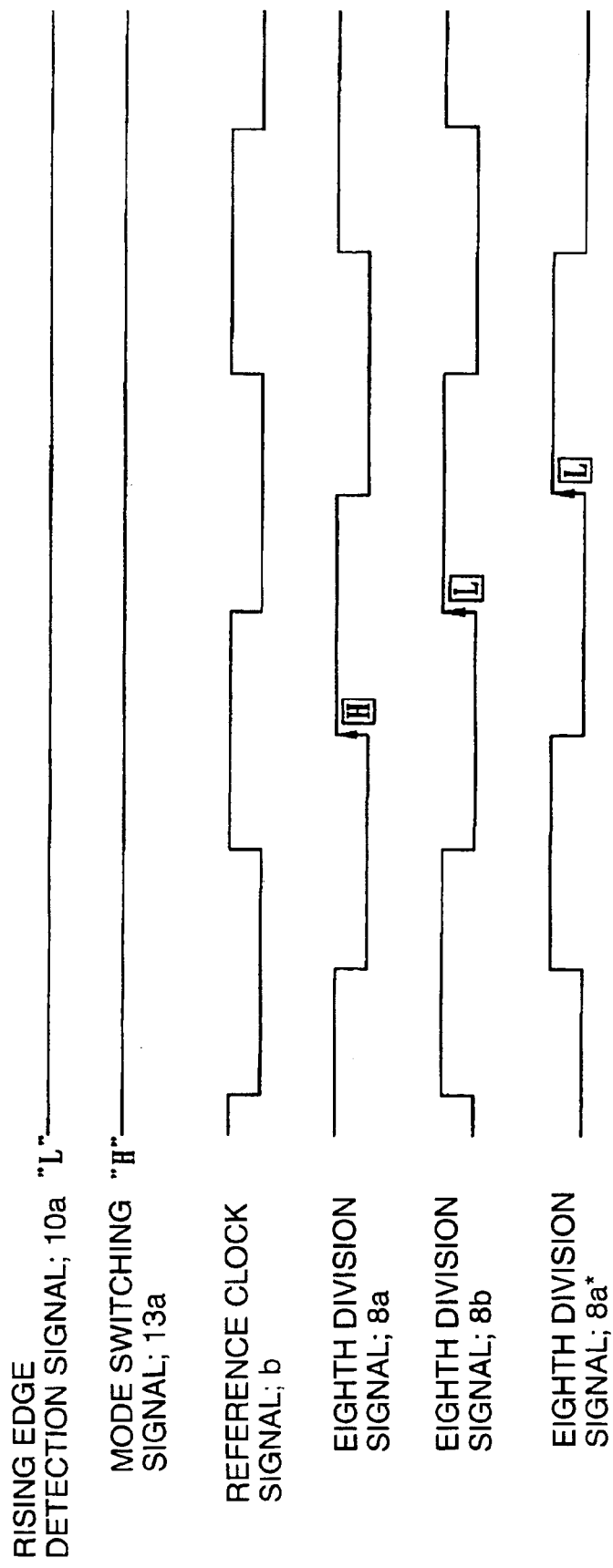
FIG. 25 is a waveform diagram (2) to explain the operation of the out of frequency synchronization detection of the embodiment.
Figure 26:
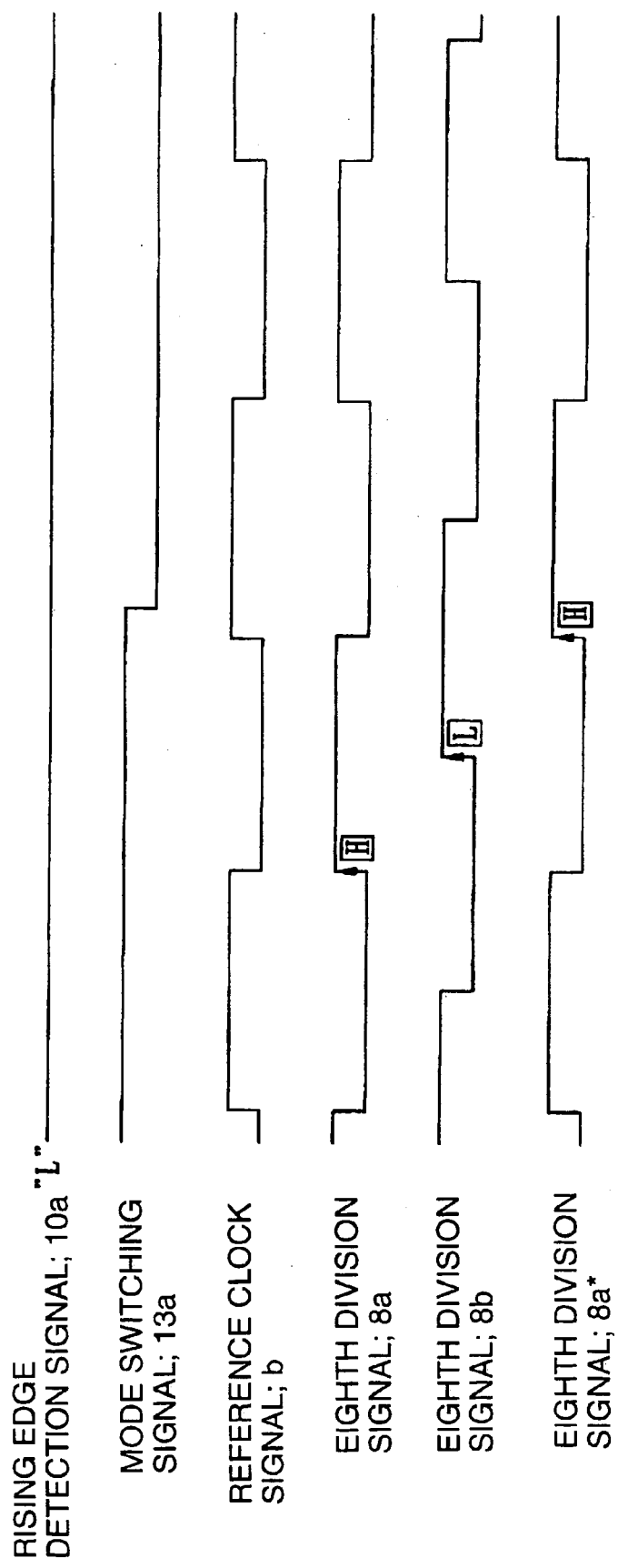
FIG. 26 is a waveform diagram (3) to explain the operation of the out of frequency synchronization detection of the embodiment.
Figure 27:
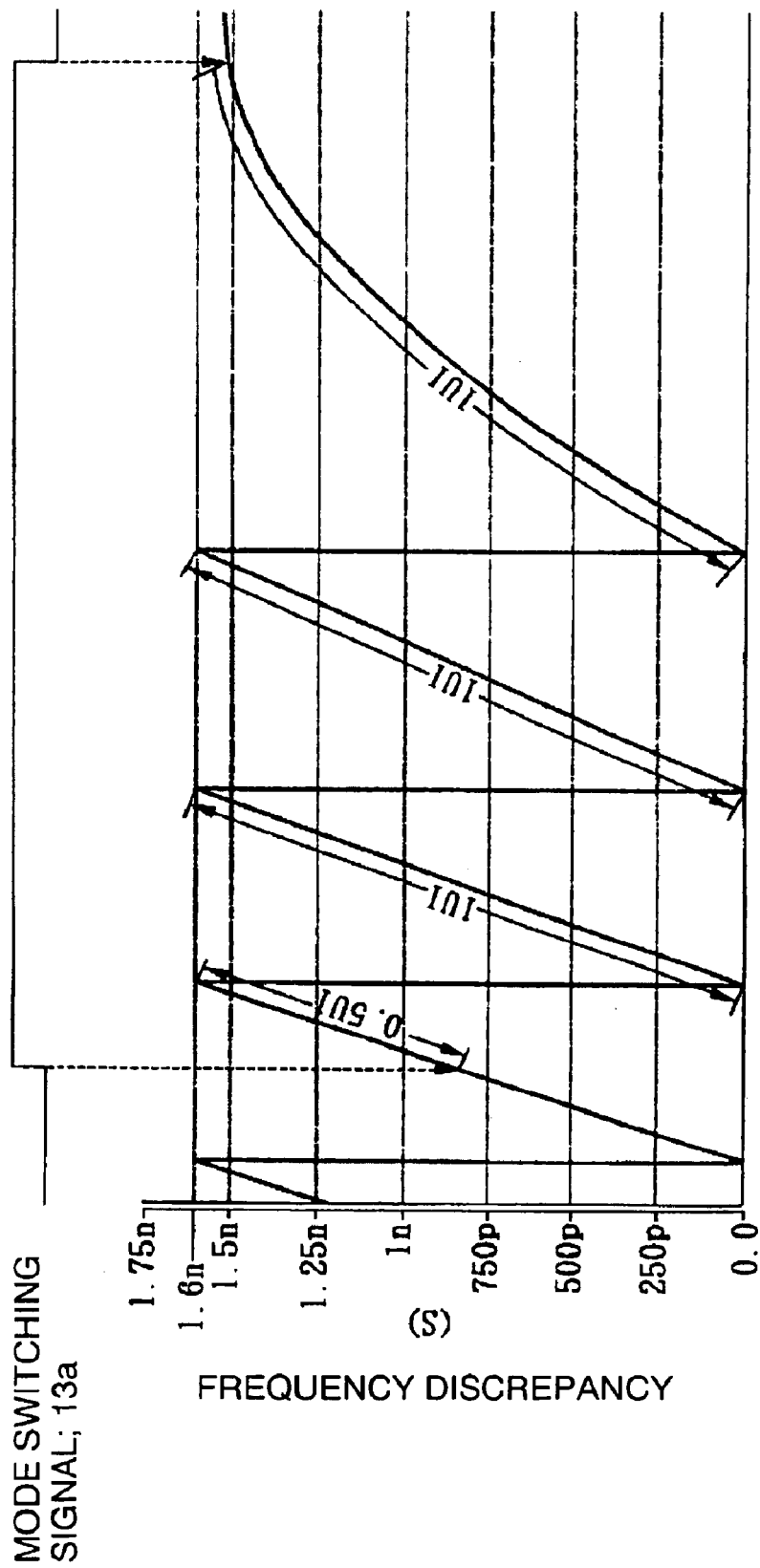
FIG. 27 is a graph (1) showing frequency discrepancy at the time of detecting out of synchronization conditions of the embodiment.
Figure 28:
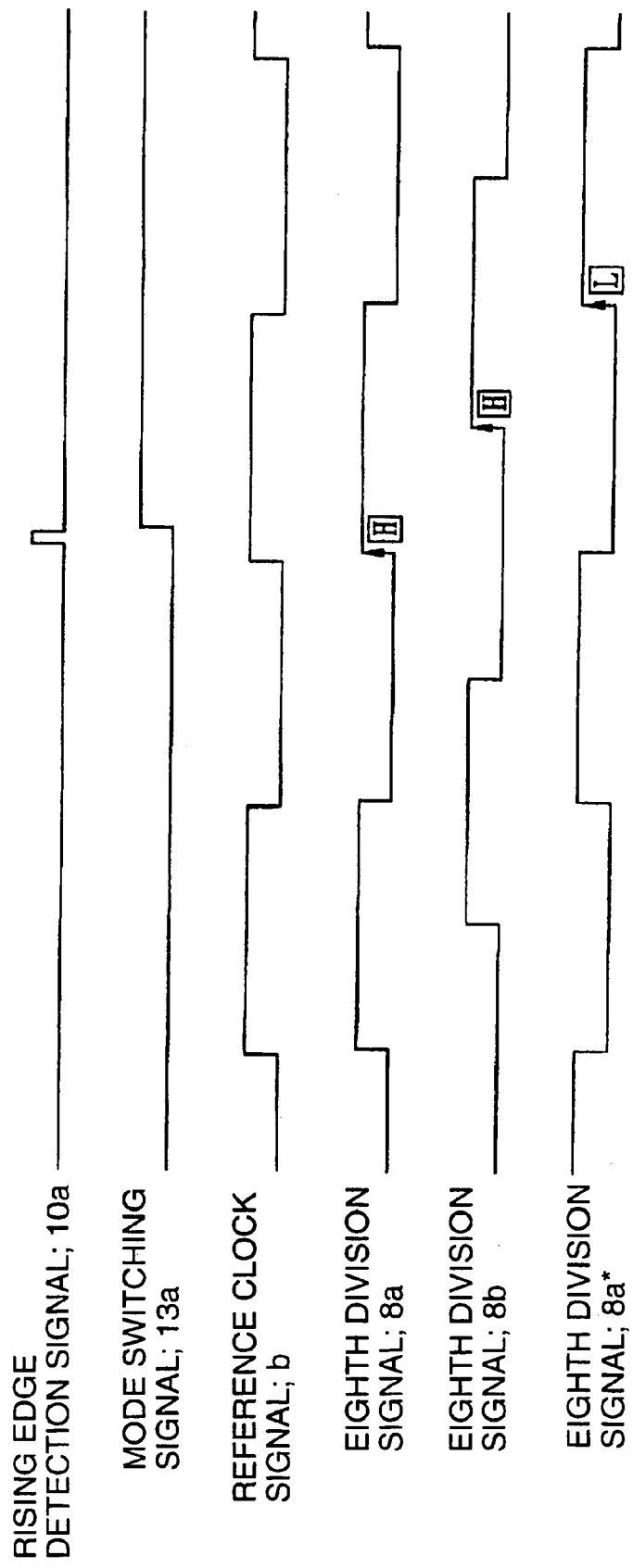
FIG. 28 is a waveform diagram (4) to explain the operation of the out of frequency synchronization detection of the embodiment.
Figure 29:
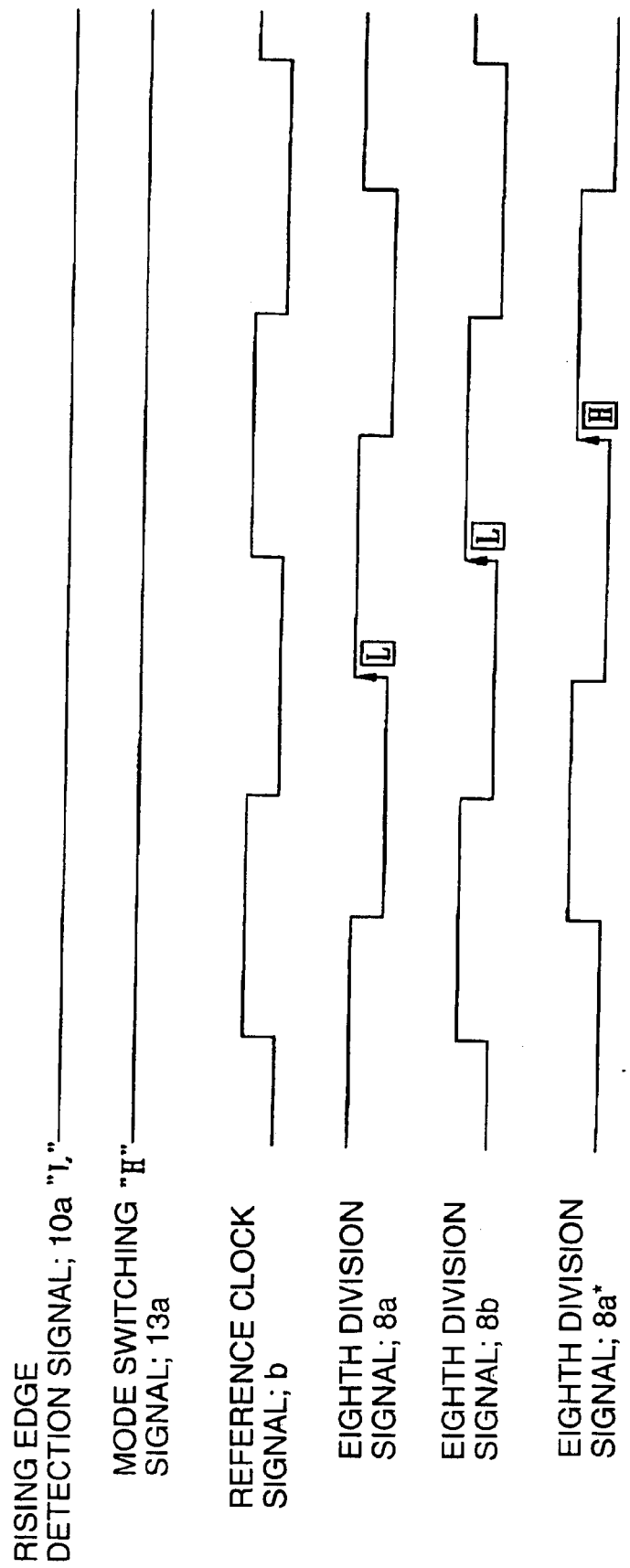
FIG. 29 is a waveform diagram (5) to explain the operation of the out of frequency synchronization detection of the embodiment.
Figure 30:
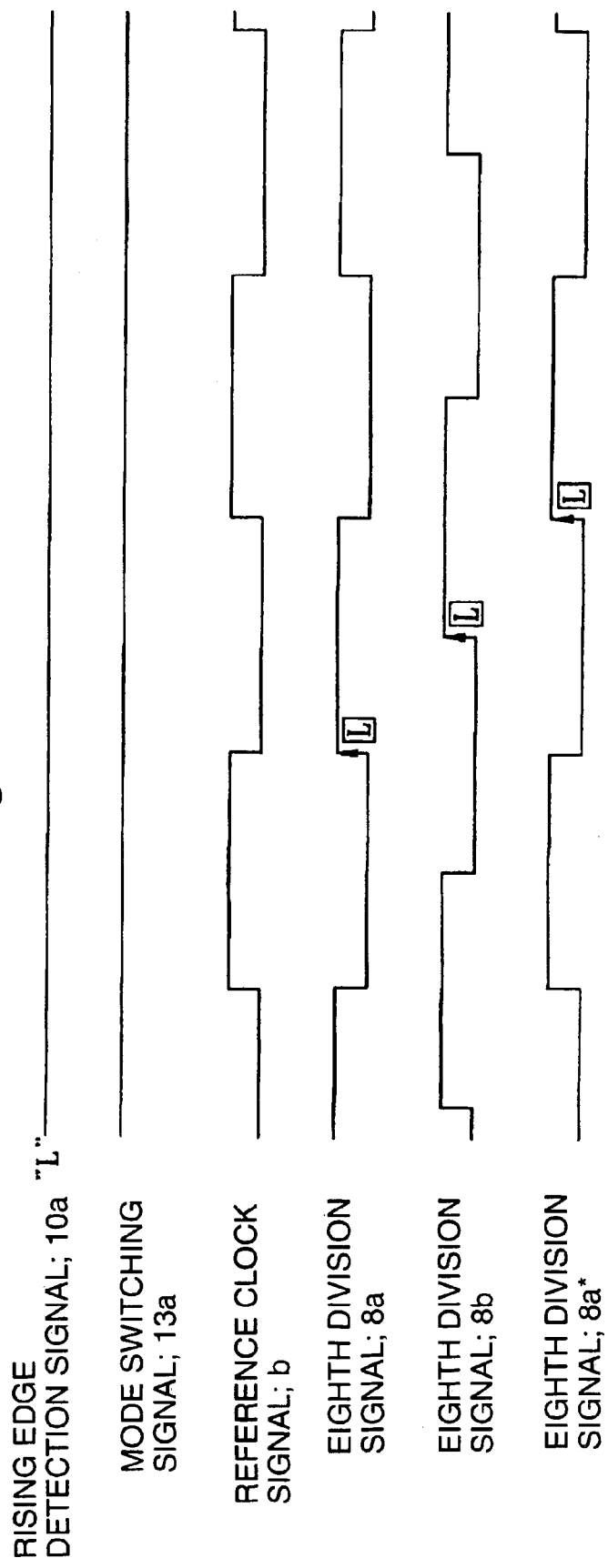
FIG. 30 is a waveform diagram (6) to explain the operation of the out of frequency synchronization detection of the embodiment.
Figure 31:
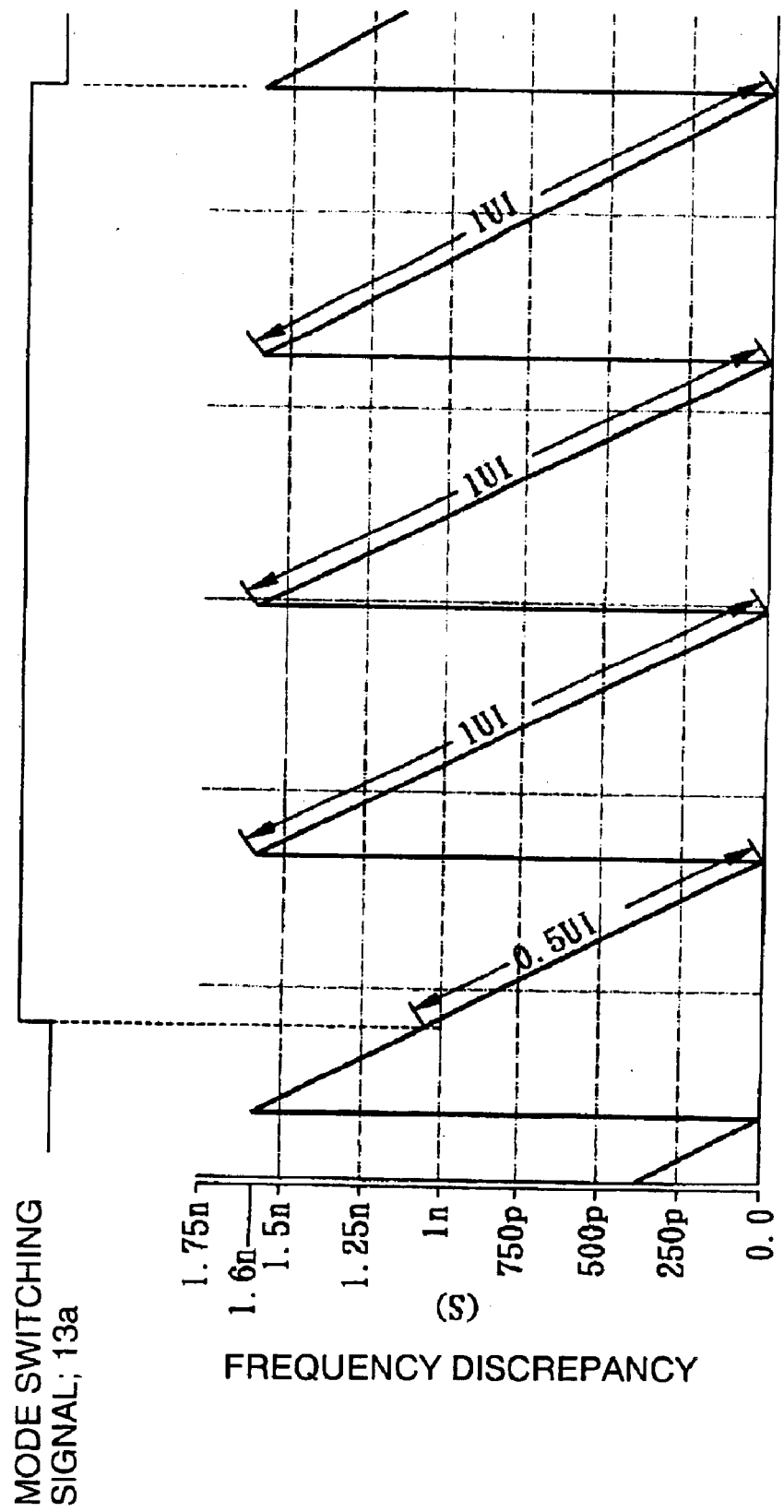
FIG. 31 is a graph (2) showing frequency discrepancy at the time of detecting out of synchronization conditions of the embodiment.
Figure 32:
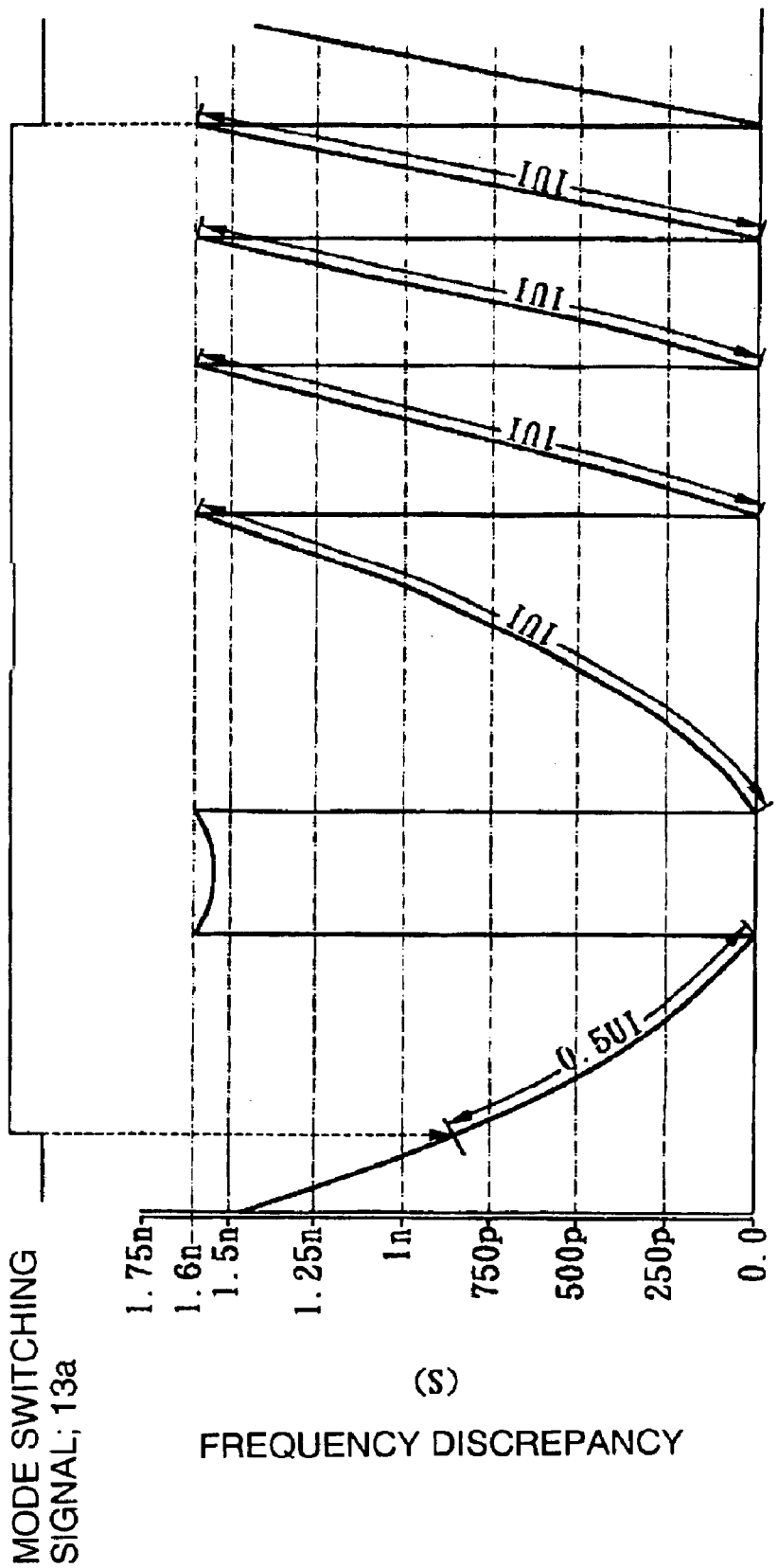
FIG. 32 is a graph (3) showing frequency discrepancy at the time of detecting out of synchronization conditions of the embodiment.
Figure 33:
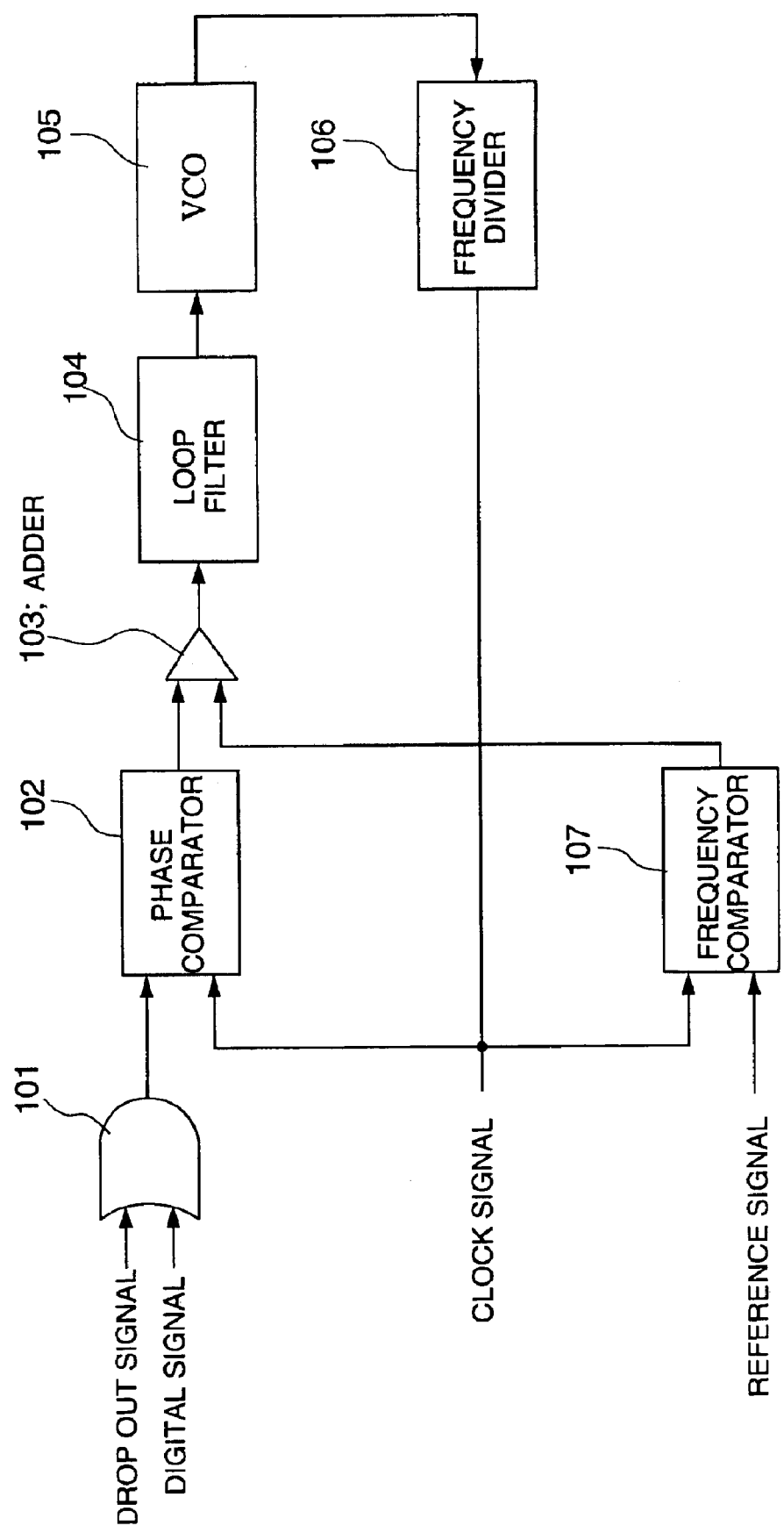
FIG. 33 is a block diagram showing a structural example of a conventional clock signal reproduction device.
Figure 34A:
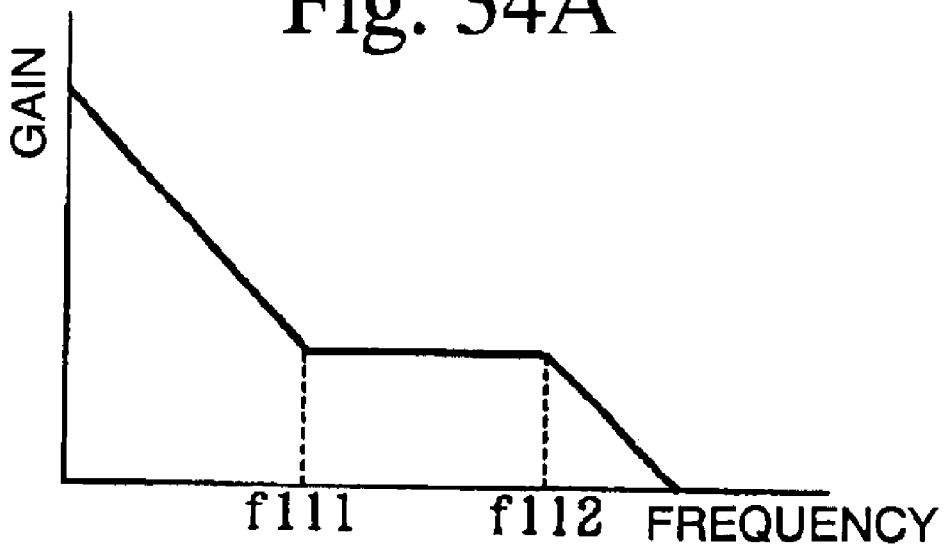
FIGS. 34A and 34B show the frequency characteristics of a loop filter and voltage controlled oscillator in the first prior art.
Figure 34B:
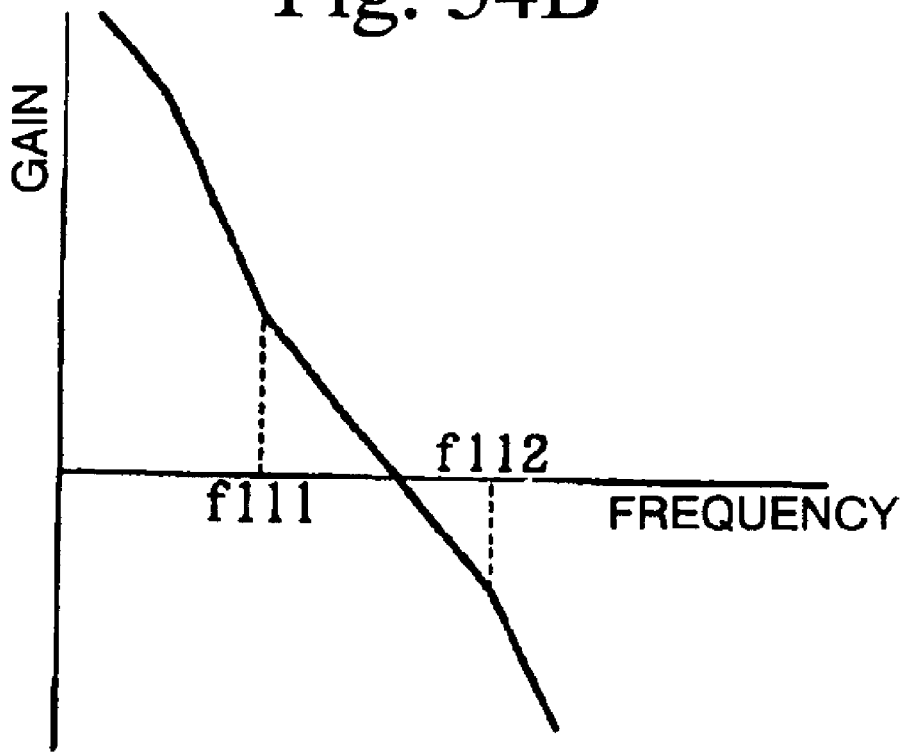
Figure 35:
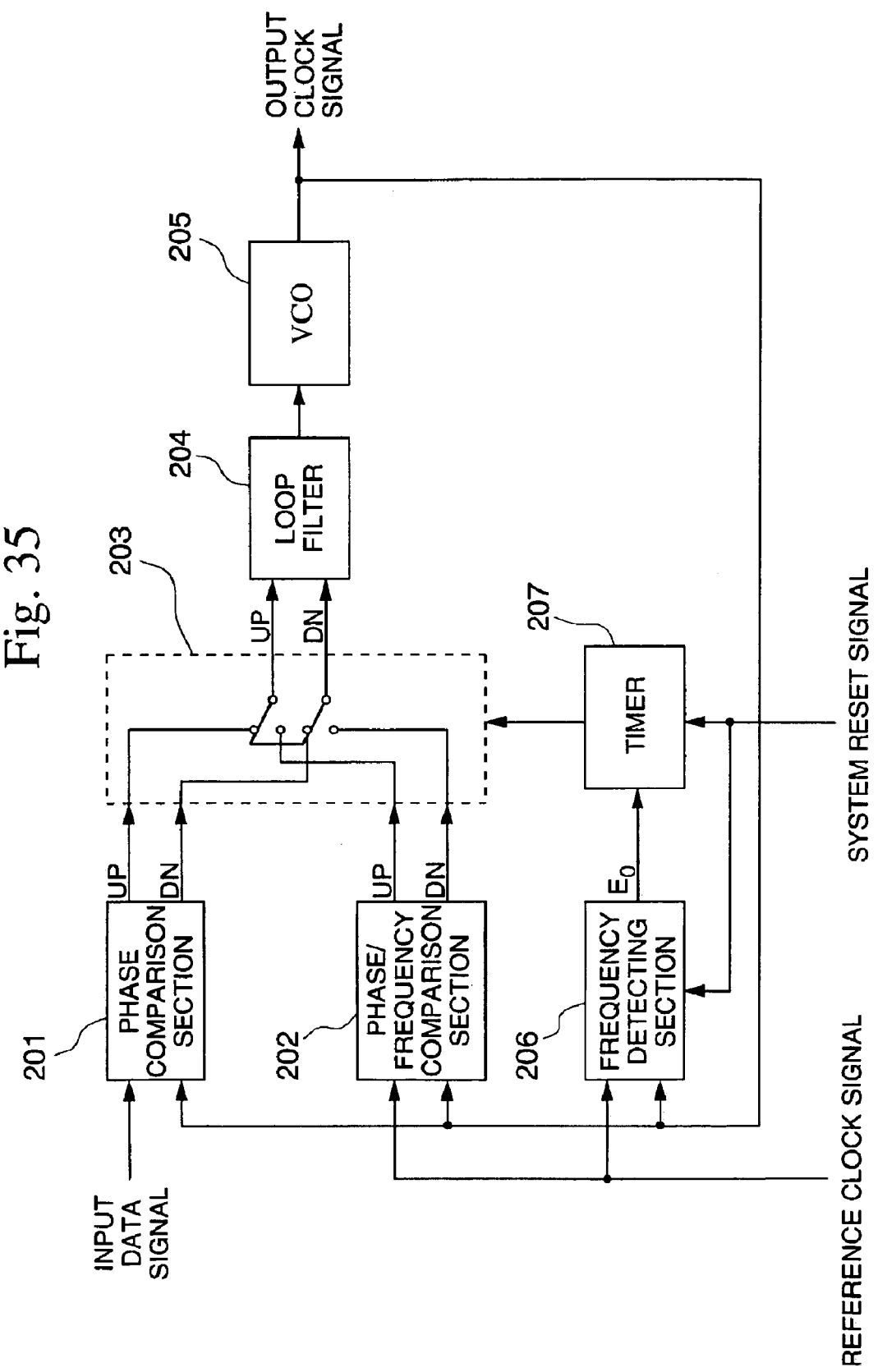
FIG. 35 is a block diagram showing another structural example of the conventional clock signal reproduction device.

FIG. 1 is a circuit diagram showing a structure of a clock signal reproduction device, being an embodiment of this invention. FIG. 2 is a block diagram showing a structural example of a phase comparator of the embodiment. FIG. 3 is a waveform diagram (1) to explain the operation of the phase comparator of the embodiment. FIG. 4 is a waveform diagram (2) to explain the operation of the phase comparator of the embodiment. FIG. 5 is a waveform diagram (3) to explain the operation of the phase comparator of the embodiment. FIG. 6 is a circuit diagram showing a structural example of a phase/frequency comparator of the embodiment. FIG. 7 is a waveform diagram showing waveforms of the output of the phase/frequency comparator of the embodiment. FIG. 8 is a waveform diagram showing a waveform of an UP signal that the phase/frequency comparator of the embodiment outputs. FIG. 9 is a waveform diagram showing a waveform of a DN signal that the phase/frequency comparator of the embodiment outputs. FIG. 10 is waveform diagram showing a waveform of the UP signal and DN signal that the phase/frequency comparator of the embodiment outputs. FIG. 11 is a circuit diagram showing a structural example of a charge pump circuit of the embodiment. FIG. 12 is a circuit diagram showing a structural example of an LPF (Low Pass Filter) of the embodiment. FIG. 13 is circuit diagram showing a structural example of an analog frequency synchronization-IN detecting circuit of the embodiment. FIG. 14 is a waveform diagram to explain the operation of the analog frequency synchronization-IN detecting circuit of the embodiment. FIG. 15 is a circuit diagram showing a structural example of a rising edge detecting circuit of the embodiment. FIG. 16 is a waveform diagram to explain the operation of the rising edge detecting circuit of the embodiment. FIG. 17 is a circuit diagram showing a structural example of a digital frequency synchronization-OUT detecting circuit of the embodiment. FIG. 18 is a waveform diagram (1) to explain the operation of the digital frequency synchronization-OUT detecting circuit of the embodiment. FIG. 19 is a waveform diagram (2) to explain the operation of the digital frequency synchronization-OUT detecting circuit of the embodiment. FIG. 20 shows an out of frequency synchronization detection truth table of the digital frequency synchronization-OUT detecting circuit of the embodiment. FIG. 21 is a circuit diagram showing a structural example of the rising edge detecting circuit of the embodiment. FIG. 22 is a waveform diagram to explain the operation of the rising edge detecting circuit of the embodiment. FIG. 23 shows an example of the jitter tolerance. FIG. 24 is a waveform diagram (1) to explain the operation of the out of frequency synchronization detection of the embodiment. FIG. 25 is a waveform diagram (2) to explain the operation of the out of frequency synchronization detection of the embodiment. FIG. 26 is a waveform diagram (3) to explain the operation of the out of frequency synchronization detection of the embodiment. FIG. 27 is a graph (1) showing the frequency discrepancy at the time of detecting out of synchronization conditions of the embodiment. FIG. 28 is a waveform diagram (4) to explain the operation of the out of frequency synchronization detection of the embodiment. FIG. 29 is a waveform diagram (5) to explain the operation of the out of frequency synchronization detection of the embodiment. FIG. 30 is a waveform diagram (6) to explain the operation of the out of frequency synchronization detection of the embodiment. FIG. 31 is a graph (2) showing frequency discrepancy at the time of detecting out of synchronization conditions of the embodiment. FIG. 32 is a graph (3) showing frequency discrepancy at the time of detecting out of synchronization conditions of the embodiment.

As shown in FIG. 1 schematically, the clock signal reproduction device of this example comprises; a phase comparator 1, a phase/frequency comparator 2, a charge pump circuit 3, a charge pump circuit 4, a mode switching selector 5, a LPF 6, a VCO 7, a frequency divider 8, an analog frequency synchronization-IN detecting circuit 9, a rising edge detecting circuit 10, a digital frequency synchronization-OUT detecting circuit 11, a rising edge detecting circuit 12, and an SR-F/F (Set Reset Flip Flop) 13.

The phase comparator 1 compares the phases of an input data signal a and an output clock signal c, and generates an UP signal 1a and a DN signal 1b based on the comparison result. The phase/frequency comparator 2 compares the frequencies and phases of a reference clock signal b and a signal 8a that is an eighth division of the output clock signal, outputs signals 2a and 2b showing the phase difference based on the comparison result, and also generates an UP signal 2c and DN signal 2d for correcting the frequency discrepancy of the output clock signal. The charge pump circuit 3 generates an output voltage based on the UP signal 1a and DN signal 1b from the phase comparator 1. The charge pump circuit 4 generates an output voltage based on the UP signal 2c and DN signal 2d from the phase/frequency comparator 2. The mode switching selector 5 switches the output voltages of the charge pump circuit 3 and the charge pump circuit 4 for output based on a mode switching signal 13a. The LPF 6 removes high frequency components from the output voltage of the mode switching selector 5 and outputs a control voltage. The frequency divider 8 divides the output clock signal c, and generates an eighth division signal 8a. The analog frequency synchronization-IN detecting circuit 9 detects that the phase difference between the eighth division signal 8a and the reference clock signal b is within a predetermined range using analog methods, and outputs a detection signal 9a. The rising edge detecting circuit 10 detects rising edges in the output of the analog frequency synchronization-IN detecting circuit 9, and outputs a rising edge detection signal 10a.

The digital frequency synchronization-OUT detecting circuit 11 detects whether the phase difference between the eighth division signal 8a and the reference clock signal b is outside of a predetermined range using digital methods, and outputs a detection signal 11a. The rising edge detecting circuit 12 detects rising edges in the output of the digital frequency synchronization-OUT detecting circuit 11, and outputs a rising edge detection signal 12a. The SR-F/F 13 is set corresponding to the rising edge detection signal 10a from the rising edge detecting circuit 10, and is reset corresponding to the rising edge detection signal 12a from the rising edge detecting circuit 12, and outputs a mode switching signal 13a.

In FIG. 1, the system of the phase comparator 1—the charge pump circuit 3—the mode switching selector 5—the LPF 6—the VCO 7—the phase comparator 1 comprises a clock recovery system and operates in phase comparison mode. The system of the phase/frequency comparator 2—the charge pump circuit 4—the mode switching selector 5—the LPF 6—the VCO 7—the frequency divider 8—the phase/frequency comparator 2 comprises a multiplication PLL system and operates in phase frequency comparison mode. Furthermore, the analog frequency synchronization-IN detecting circuit 9, the rising edge detecting circuit 10, and the SR-F/F 13 form a frequency synchronization (in) detecting block, and the digital frequency synchronization-OUT detecting circuit 11, the rising edge detecting circuit 12, and the SR-F/F 13 form a frequency synchronization (out) detecting block.

As follows is a detailed description of the structure and operation of each section. The phase comparator 1 of this example, as shown in FIG. 2, comprises D type flip flops 1A and 1B, an inverter 1C, EOR (exclusive OR) circuits 1D and 1E, and an inverter 1F. The input data signal a is input to an input terminal D of a flip flop 1A, and a clock signal c from the VCO 7 is input to the clock terminal. An output signal 1c from the flip flop 1A is input to the input terminal D of a flip flop 1B, and an inverse clock signal 1e that is inverted from the clock signal c via the inverter 1C is input to the clock terminal. The EOR 1D performs an exclusive OR operation on the input data signal a and the output signal 1c of the flip flop 1A, inverts the calculated result through the inverter 1F, and outputs the UP signal 1a. Furthermore, the EOR 1E performs an exclusive OR operation on the output signal 1c from the flip flop 1A and the output signal 1d from the flip flop 1B, and outputs the DN signal 1b depending on the calculated result.

The phase comparator 1 compares the phase of the input data signal a and the phase of the output clock signal c from the VCO 7 and, based on the comparison result, generates the UP signal 1a and DN signal 1b to correct the phase difference between the two signals. At this time the UP signal 1a to the charge pump circuit 3 in the latter stage is active low level, and the DN signal 1b is active high level. When the phase of the output clock signal c is in synchronization with the input data signal a, the rising edge of the clock signal c is located in the center of the input data signal a, and the pulse widths of the UP signal 1a and DN signal 1b are equal. At other times the operation is such that the pulse widths of the UP signal 1a and DN signal 1b change.

For example, in the case where the phase of the output clock signal c is lagging the input data signal a, the waveforms of the output signal 1c, the inverse clock signal 1e and the output signal 1d are as shown in FIG. 3, in which the low level pulse width of the UP signal 1a is longer than the high level pulse width of the DN signal 1b.

Furthermore, in the case where the phase of the output clock signal c is in synchronization with the input data signal a, the waveforms of the output signal 1c, the inverse clock signal 1e and the output signal 1d are as shown in FIG. 4, in which the low level pulse width of the UP signal 1a is the same as the high level pulse width of the DN signal 1b.

Moreover, in the case where the phase of the output clock signal c is leading the input data signal a, the waveforms of the output signal 1c, the inverse clock signal 1e and the output signal 1d are as shown in FIG. 5, in which the low level pulse width of the UP signal 1a is shorter than the high level pulse width of the DN signal 1b.

Here, the phase comparator is similar to that described in the following document. Charles R Hogger, Jr. "A Self Correcting Clock Recovery Circuit" IEEE, TRANSACTIONS ON ELECTRON DEVICES, Vol. ED-32, No. 12, December 1985.

The phase/frequency comparator 2 of this example, as shown in FIG. 6, comprises inverters 2A, 2B, 2M, 2N 2P, 2R~2T, 2V~2Y, NAND gates 2C~2H, 2J and 2K, and NOR gates 2L, 2Q and 2U. Among them, a first flip flop is formed by the NAND gates 2D and 2E, and a second flip flop is formed by the NAND gates 2G and 2H. Furthermore, a reset circuit is formed by the NOR gate 2Q and the inverters 2R and 2S.

The reference clock signal b is fed to the NAND gate 2C via the inverter 2A. The NAND gate 2C performs a NAND operation on the output from the previous time and the reference clock signal b, and outputs the calculated result to the NAND gate 2F. The NAND gate 2F performs a NAND operation on the output of the first flip flop and the output from the NAND gate 2C, and generates an output signal 2a.

Furthermore, an eighth division signal 8a from a frequency divider 8 is fed to the NAND gate 2J via the inverter 2B. The NAND gate 2J performs a NAND operation on the output from the previous time and the eighth division signal 8a, and outputs the calculated result to the NAND gate 2K. The NAND gate 2K performs a NAND operation on the output of the second flip flop and the output from the NAND gate 2J, and generates an output signal 2b.

The relationship between the output signal 2a and 2b is shown in FIG. 7. That is to say, the output signal 2a is generated based on the reference clock signal b, whose duty cycle is fixed. On the other hand, the output signal 2b is generated based on the eighth division signal 8a, being the output clock signal c divided by 8, whose duty cycle changes based on the phase difference between the eighth division signal 8a and the reference clock signal b. Accordingly, the phase/frequency comparator 2 indicates a supervision result of the frequency of the output clock signal c, by the output signals 2a and 2c. That is to say, the phase/frequency comparator 2 checks the phase difference between the eighth division signal 8a and the reference clock signal b, and expresses the frequency difference of the output clock signal c as a change in the duty cycle of the output signals 2a and 2b.

Furthermore, in the phase/frequency comparator 2, the output signal 2a is output to the NOR gate 2L. The NOR gate 2L performs a NOR operation on the reset signal from the reset circuit and the output signal 2a, and outputs it to the inverter 2M. The inverter 2M inverts the output from the NOR gate 2L and generates an output signal. The output signal from the inverter 2M is output to the NAND gate 2C, and also output as an UP signal 2c via the inverters 2N and 2P.

Moreover, the output signal 2b is output to the NOR gate 2U. The NOR gate 2U performs a NOR operation on the reset signal from the reset circuit and the output signal 2b, and outputs it to the inverter 2V. The inverter 2V inverts the output from the NOR gate 2U and generates an output signal. The output signal from the inverter 2V is output to the NAND gate 2J, and also output as a DN signal 2d via the inverters 2W and 2X.

The relationship between the UP signal 2c and DN signal 2d is as follows. That is, when the frequency of the eighth division signal 8a is lower than the reference clock signal b input to the phase/frequency comparator 2, as shown in FIG. 8, the UP signal 2c is output as a downward pulse that is generated at the rising edges of the eighth division signal 8a and the reference clock signal b. During this period, the phase/frequency comparator 2 does not output the DN signal 2d.

Furthermore, when the frequency of the eighth division signal 8a is higher than the reference clock signal b, as shown in FIG. 9, the DN signal 2d is output as an upward pulse that is generated at the rising edges of the eighth division signal 8a and the reference clock signal b. During this period, the phase/frequency comparator 2 does not output the UP signal 2c.

Moreover, when the phase of the eighth division signal 8a lags the reference clock signal b after the frequency of the eighth division signal 8a coincides with the frequency of the reference clock signal b, the phase/frequency comparator 2, as shown in FIG. 10, outputs the UP signal 2c. When the phase of the eighth division signal 8a leads the reference clock signal b, the phase/frequency comparator 2 outputs the DN signal 2d similarly as shown in FIG. 10.

In this manner, when the frequency of the eighth division signal 8a gets close to the frequency of the reference clock signal b, the pulse width of the UP signal 2c or the DN signal 2d becomes shorter. When the frequency of the eighth division signal 8a coincides with the frequency of the reference clock signal b, neither the UP signal 2c nor the DN signal 2d is output. Accordingly, the phase/frequency comparator 2 is suitable for detecting when the frequency difference between the eighth division signal 8a and the reference clock signal b is large.

The UP signal 1a and the DN signal 1b of the phase comparator 1 are input to the charge pump circuit 3, the UP signal 2a and the DN signal 2d of the 2 are input to the charge pump circuit 4, and each generates a control voltage for the VCO 7. The charge pump circuit 3 and the charge pump circuit 4 have the same structure, and perform the same operation, and therefore the construction and operation are described using the charge pump circuit 4 as an example.

The charge pump circuit 4 of this example, as shown in FIG. 11, is provided with: P (Positive) type MOS (Metal Oxide Semiconductor) FETs (Field Effect Transistors) 4A, 4B, 4F, 4J, 4K, 4L, 4N, N (Negative) type MOSFETs 4C, 4D, 4G, 4H, 4P, 4R~4T, and inverters 4M, 4Q.

Since a preset bias voltage is applied to the transistor 4C, by passing a first set current corresponding to this bias voltage the transistor 4C generates a first set voltage at a node 4a with the transistor 4A.

The transistors 4A and 4B comprise a current mirror circuit, and pass current of the same value as the first set current to the transistor 4D. The transistor 4D operates as a resistive load, and generates a first level voltage at a connection point 4b with the transistor 4B by the first set current. The transistor 4E passes a second set current corresponding to the first set voltage. The transistors 4G and 4H comprise a current mirror circuit, and pass current of the same value as the second set current to the transistor 4F. The transistor 4F operates as a resistive load, and generates a second level voltage at a connection point 4c with the transistor 4H by the second set current.

A voltage corresponding to the first level voltage is applied between the sources and drains of transistors 4J and 4K, and a voltage corresponding to the first level voltage is applied between the drains and sources of the transistors 4S and 4T. Furthermore, the circuit comprising the transistors 4L, 4N and the inverter 4M switches the amount of current to be fed to the transistors 4P and 4R according to the UP signal 2c, and the circuit comprising the transistors 4P, 4R and the inverter 4Q switches the amount of current to be fed to the transistor 4S according to the DN signal 2d.

In this manner, depending on the output voltage at the connecting point of the transistors 4L and 4P, the charge pump circuit 4 sources current during the period when the UP signal 2c is at a low level, and sinks current during the period when the DN signal 2d is at a high level. Furthermore, during the period when the UP signal 2c is at a high level and the DN signal 2d is at a low level, it neither sinks nor sources current.

A mode switching selector 5, depending on the high level or low level of a mode switching signal 13a, outputs the output voltage of the charge pump circuit 3 or the charge pump circuit 4 to the LPF 6. In this way, the charge pump circuit 3 or the charge pump circuit 4 charges the LPF 6 when the UP signal 1a or 2c is at a low level, and discharges the LPF 6 when the DN signal 1b or 2d is at a high level. Furthermore, when the UP signal 1a or 2c is at a high level, and the DN signal 1b or 2d is at a low level, charge and discharge of the LPF 6 is not performed, and the preceding voltage level is maintained.

The LPF 6 of this example, as shown in FIG. 12, is provided with a resistor 6A and capacitors 6B, 6C, which remove the high frequency components of the output voltage of the charge pump circuit 3 or the charge pump circuit 4, and performs the operation of passing only low frequency components.

In this way, abrupt changes in the output voltage from the charge pump circuits are avoided, and a control voltage is generated for the VCO 7.

The frequency divider 8 divides the output clock signal c from the VCO 7 into eight to generate an eighth division signal 8a, and also shifts the phase of the eighth division signal 8a by 90 o to generate an eighth division signal 8b.

The analog frequency synchronization-IN detecting circuit 9 of this example, as shown in FIG. 13, is provided with; inverters 9A, 9B, 9D, 9E, 9F, 9H, 9J, 9L, 9M, 9P, 9R, an EOR gate 9C, D type flip flops 9G, 9K, 9N, 9S, and a NAND gate 9Q.

The inverters 9A, 9B, 9D, 9E, and the EOR gate 9C form a reset circuit, and generate a reset signal based on the output signals 2a, 2b. That is to say, the EOR gate 9C performs an exclusive OR operation on the output signal 2a inverted by the inverter 9A and the output signal 2b inverted by the inverter 9B, and thus generates a high level reset signal in the case where the level of the output signal 2a and the level of the output signal 2b are different.

The pulse width of the reset signal, as shown in FIG. 14, becomes shorter as the period that the levels of the output signals 2a and 2b are different becomes shorter, and when the pulse widths of the output signals 2a and 2b become equal, the reset signal is not output.

The inverters 9F, 9J, 9L, 9M, 9P, and the flip flops 9G, 9K, 9N comprise a three stage counter. A reset signal is input to the clear terminals CLR of the flip flops 9G, 9K, 9N.

The reference clock signal b is input to the clock terminal of the flip flop 9G of the first stage counter via the inverter 9F. Furthermore, the output of the flip flop 9G is fed to the input terminal D of the flip flop 9G via the inverter 9H. As a result, the output condition of the flip flop 9G is inverted each time the pulse of the reference clock signal b is input. The output of the flip flop 9G is input to the clock terminal of the flip flop 9K of the second stage counter via the inverter 9J. Moreover, the output of the flip flop 9K is fed to the input terminal D of the flip flop 9K via the inverter 9L. As a result, the output condition of the flip flop 9K is inverted each time the output of the flip flop 9G changes from a high level to a low level. The output of the flip flop 9K is input to the clock terminal of the flip flop 9N of the third stage counter via the inverter 9M. Moreover, the output of the flip flop 9N is fed to the input terminal D of the flip flop 9N via the inverter 9P. As a result, the output condition of the flip flop 9N is inverted each time the output of the flip flop 9K changes from a high level to a low level.

In this manner, the outputs of the flip flops 9G, 9K, 9N change as follows, as the pulses of the reference clock signal b are fed in.

(1, 0, 0), (0, 1, 0), (1, 1, 0), (1, 1, 1)

The circuit that comprises the NAND gate 9Q and the inverter 9R feeds a high level output to the clock terminal of the flip flop 9S when the output condition of the flip flops 9G, 9K, 9N becomes (1, 1, 1).

On the other hand, a reset signal is input to the clear terminals CLR of the three stage flip flops 9G, 9K, 9N. Accordingly, if the reset signal is input before the output condition of the flip flops 9G, 9K, 9N reaches (1, 1, 1), the flip flops 9G, 9K, 9N are reset.

Then, when the frequencies of the eighth division signal 8a and the reference clock signal b almost coincide, the pulse width of the reset signal becomes shorter, the flip flops 9G, 9K, 9N are not reset, and hence the output condition of the flip flops 9G, 9K, 9N becomes (1, 1, 1). As a result, the NAND gate 9Q and the inverter 9R feed an output that changes from a low level to a high level to the flip flop 9S.

The output of the inverter 9R is fed to the clock terminal of the flip flop 9S, and a power supply voltage VDD is fed to the input terminal D. When the output from the inverter 9R changes from a low level to a high level after the reset signal is input to the clear terminal CLR, the detection signal 9a, being the output from the flip flop 9S, becomes high level.

In this way, the analog frequency synchronization-IN detecting circuit 9 outputs a detection signal 9a at a high level when the phase difference between the eighth division signal 8a and the reference clock signal b is within a predetermined range where the EOR gate 9C does not generate an output pulse.

The rising edge detecting circuit 10 of this example, as shown in FIG. 15, is provided with inverters 10A~10K, 10M, and a NAND gate 10L.

The inverters 10A~10K form a delay circuit, which delays the detection signal 9a, as shown in FIG. 16, and generates a delay detection signal. The NAND gate 10L performs a NAND operation on the detection signal 9a and the delay detection signal from the inverter 10K, and generates an operation result signal.

The inverter 10M inverts the operation result signal and outputs the rising edge detection signal 10a. The rising edge detection signal 10a indicates that the phase difference between the eighth division signal 8a and the reference clock signal b is within the predetermined range.

The digital frequency synchronization-OUT detecting circuit 11 of this example, as shown in FIG. 17, is provided with D type flip flops 11A, 11B, 11D, an inverter 11C, an EOR circuit 11E, and an OR circuit 11F.

The flip flop 11A latches the reference clock signal b using the eighth division signal 8a as a clock and generates a high level output. The flip flop 11B latches the reference clock signal b using the eighth division signal 8a as a clock, and generates a high level output. The flip flop 11D latches the reference clock signal b using the eighth division signal 8a* (* denotes an inverse signal), being the inverse signal of the eighth division signal 8a, via the inverter 11C as a clock, and generates a high level output. The EOR circuit 11E, which comprises NOR gates 111, 112, a NAND gate 113, and an inverter 114, generates an output of an exclusive OR operation on the output of the flip flop 11A and the output of the flip flop 11D. The OR circuit 11F, which comprises a NOR circuit 115, and an inverter 116, generates a detection signal 11a as an output of an OR operation on the output of the EOR circuit 11E and the output of the flip flop 11B.

The digital frequency synchronization-OUT detecting circuit 11 judges the phase difference condition between the eighth division signal 8a and the reference clock signal b from the phase relationship of each rising edge of the eighth division signal 8a, the eighth division signal 8b, and the eighth division signal 8a* and the reference clock signal b.

Next is a description of the operation of detecting out of frequency synchronization conditions in the digital frequency synchronization-OUT detecting circuit 11 of this example with reference to FIG. 18 and FIG. 19.

In FIG. 18, (a)~(d) represent changes in the relative location relationship of the eighth division signal 8a, the eighth division signal 8b, and the eighth division signal 8a* to the reference clock signal b. The case where the rising edges of each of the eighth division signal 8a, the eighth division signal 8b, and the eighth division signal 8a* are located in the high level half period of the reference clock signal b is denoted as H, and the case where it is not located there as L.

In the figure, (a) and (b) represent a condition immediately after phase synchronization in the multiplication PLL system is completed and the system is switched to the clock recovery system, and indicate that an 800 ps phase difference, corresponding to half the period of the output clock signal c, occurs between the eighth division signal 8a and the reference clock signal b. Item (a) is H at the time of both of the rising edges of the eighth division signal 8b and the eighth division signal 8a*, and is only L at the rising edge of the eighth division signal 8a. Furthermore, (b) is H at both of the rising edges of the eighth division signal 8a and the eighth division signal 8b, and is only L at the rising edge of the eighth division signal 8a*.

Next, (c) shows the condition where, based on a frequency change of the output clock signal, the phase of each of the rising edges of the eighth division signals changes to a lag, and is H at both of the rising edges of the eighth division signal 8b and the eighth division signal 8a*, and is only L at the rising edge of the eighth division signal 8a. Item (d) shows the condition where the phase of each of the rising edges of the eighth division signals changes toward a greater lag, and is only H at the rising edge of the eighth division signal 8a*, and is L at both of the rising edges of the eighth division signal 8a and the eighth division signal 8b.

Furthermore, in FIG. 19, similarly, (a) and (b) represent a condition immediately after phase synchronization in the multiplication PLL system is completed and the system is switched to the clock recovery system. Item (c) shows the condition where, based on the frequency change of the output clock signal, the phase of each of the rising edges of the eighth division signals changes to a lead, and is H at both of the rising edges of the eighth division signal 8a and the eighth division signal 8b, and is only L at the rising edge of the eighth division signal 8a*. Item (d) shows the condition where the phases of each of the rising edges of the eighth division signals changes toward a greater lead, and is only H at the rising edge of the eighth division signal 8a, and is L at both of the rising edges of the eighth division signal 8b and the eighth division signal 8a*.

The full judgment conditions of the detection of out of frequency synchronization are as specified in the truth table shown in FIG. 20. In the figure, (1) and (4) shown with a circle symbol appended, indicate the conditions during phase following, and correspond to the condition of (d) as shown in FIG. 18 and FIG. 19. Items (2) and (3) shown with a circle symbol, appended indicate the conditions immediately after synchronization, and correspond to the conditions of (a) and (b) as shown in FIG. 18 and FIG. 19. In these cases the digital frequency synchronization-OUT detecting circuit 11 judges that the output clock signal a is in a frequency synchronization condition with the reference clock signal b, and sets the detection signal 11a to high level.

Furthermore, (5) and (6) shown with a cross symbol appended, indicate conditions out of phase synchronization, or a low degree out of frequency synchronization, and (7) shown with a cross symbol appended, indicates a high degree out of frequency synchronization. In these cases the digital frequency synchronization-OUT detecting circuit 11 judges that the output clock signal a is in an out of phase synchronization condition or an out of frequency synchronization condition with the reference clock signal b, and sets the detection signal 11a to low level.

In this manner, as shown in FIG. 20 for example, when the digital frequency synchronization-OUT detecting circuit 11 detects that the phase difference between a signal divided from the clock signal and the reference clock signal is within a predetermined range, it sets the detection signal 11a to high level to indicate that the clock signal is in frequency synchronization.

The rising edge detecting circuit 12 of this example, as shown in FIG. 21, is provided with inverters 12A~12L, 12N, and a NAND gate 12M.

The inverter 12A inverts the detection signal 11a from the digital frequency synchronization-OUT detecting circuit 11. The inverters 12B~12L form a delay circuit, which delays the detection signal 11a and generates a delay detection signal. The NAND gate 10M performs a NAND operation on the detection signal 11a and the delay detection signal from the inverter 12L, and generates a result signal. The inverter 12N inverts the result signal, and as shown in FIG. 22, outputs a rising edge detection signal 12a. The rising edge detection signal 12a indicates that the phase difference between the signal divided from the clock signal and the reference clock signal is outside the predetermined range.

The SR-F/F 13 is set by the rising edge detection signal 10a being fed to the set terminal S and generating a high level output, and is reset by the rising edge detection signal 12a being fed to the reset terminal R and generating a low level output.

The output of the SR-F/F 13 is fed to the mode switching selector 5 as a mode switching signal 13a. The mode switching selector 5 selects the output voltage of the charge pump circuit 3 and applies it to the LPF 6 when the mode switching signal 13a is at a high level, and selects the output voltage of the charge pump circuit 4 and applies it to the LPF 6 when the mode switching signal 13a is at a low level.

Next is a description of the operation of the clock signal reproduction device of this example with reference to FIG. 1 through FIG. 22.

As follows is a description of a case wherein, for example, a 622 Mbps NRZ (Non Return to Zero) signal a is used as an input data signal, a 77.75 MHz reference clock signal b is used, and a 622 MHz output clock signal c is generated.

The digital frequency synchronization-OUT detecting circuit 11 constantly monitors for changes of the frequencies of the eighth division signals 8a and 8b against the reference clock signal b. If the frequency of the output clock signal c from the VCO 7 changes considerably for any reason, the digital frequency synchronization-OUT detecting circuit 11 outputs the detection signal 11a. In this manner, the rising edge detecting circuit 12 outputs the edge detection signal 12a, so that the mode switching signal 13a from the SR-F/F 13 becomes low level, and hence the mode switching selector 5 is in a condition to select the output voltage of the charge pump circuit 4.

In this condition, by the UP signal 2c and the DN signal 2d from the phase/frequency comparator 2, the output voltage generated in the charge pump circuit 4 is applied to the LPF 6, and thus the control voltage generated through the LPF 6 is applied to the VCO 7. Therefore, the VCO 7 generates the output clock signal c at a frequency corresponding to this control voltage.

The output clock signal c is divided into eight by the frequency divider 8, and the eighth division signal 8a is generated. The phase/frequency comparator 2 generates the UP signal 2c and DN signal 2d using the reference clock signal b and the eighth division signal 8a as inputs, and hence the multiplication PLL system performs a feed back operation by the phase frequency comparison mode such that the phases of both of the signals are coherent. As a result, the frequency of the eighth division signal 8a gets close to the frequency of the reference clock signal b.

In the condition that the frequencies of the eighth division signal 8a and the reference clock signal b are different from each other, since the phase/frequency comparator 2 outputs the output signals 2a and 2b with different duty cycles, the analog frequency synchronization-IN detecting circuit 9 does not output the detection signal 9a. Therefore, the rising edge detecting circuit 10 does not output the rising edge detection signal 10a.

When the frequencies of the eighth division signal 8a and the reference clock signal b get close by the operation of the multiplication PLL system, since the phase/frequency comparator 2 outputs the output signals 2a and 2b with similar duty cycles, the analog frequency synchronization-IN detecting circuit 9 changes the detection signal 9a from low level to high level. The rising edge detecting circuit 10 detects the rising edge of the detection signal 9a, and outputs the rising edge detection signal 10a, and hence the SR-F/F 13 sets the mode switching signal 13a to high level.

Due to the mode switching signal 13a becoming high level, the mode switching selector 5 selects the output of the charge pump circuit 3. In this condition, by the UP signal 1a and the DN signal 1b from the phase/frequency comparator 1, the output voltage generated in the charge pump circuit 3 is applied to the LPF 6. As a result, the control voltage generated by the LPF 6 is applied to the VCO 7, and hence the VCO 7 generates the output clock signal c at a frequency corresponding to this control voltage.

The phase/frequency comparator 1 inputs the output clock signal c and the input data signal a to generate the UP signal 1a and DN signal 1b, and hence the clock recovery system performs a feed back operation by using the phase comparison mode such that the phases of both of the signals are coherent. As a result, the output clock signal c comes into synchronization with the input data signal a.

The digital frequency synchronization-OUT detecting circuit 11 constantly monitors for changes in the frequencies of the eighth division signals 8a and 8b against the reference clock signal b. However, while the clock recovery system is operating, the digital frequency synchronization-OUT detecting circuit 11 and the rising edge detecting circuit 12 do not take part in generating the output clock signal c.

If the frequency of the output clock signal c from the VCO 7 changes considerably for any reason, the digital frequency synchronization-OUT detecting circuit 11 outputs the detection signal 11a. As a result, the operation of the multiplication PLL system is restarted.

That is to say, the clock signal reproduction device of this example has two systems: a system that operates as a multiplication PLL system for the external reference clock signal (78 MHz) to synchronize the frequency and phase of the eighth division signal; and a system that operates as a clock recovery system for the input data signal (622 MHz) to synchronize the frequency and phase of the output clock signal.

Firstly, the system operates as a multiplication PLL and synchronizes the frequency and phase to the reference clock signal. At the time that synchronization is achieved, by switching to the clock recovery system using digital methods, operation is performed such that phase synchronization to the input data signal is achieved.

If the frequency of the input data signal changes considerably during operation of the clock recovery system, and the clock recovery system cannot follow the input data signal, the digital frequency synchronization-OUT detecting circuit detects this condition and switches back to the multiplication PLL system.

In this case, since the amount of allowable variation (jitter tolerance) of the input data signal frequency to be followed is fixed in advance, it is necessary to adjust for variation within this range by the clock recovery system operation, and not to switch to the multiplication PLL system.

FIG. 23 shows an example of jitter tolerance, which indicates jitter tolerance in the case of a SONET (Synchronous Optical Network) that is defined in ITU-T (International Telecommunication Union-Telecommunication Standardization Sector) G. 958, and that specifies following to an input jitter amplitude of 1.5 UI (Unit Interval) p-p within a range of 300 Hz~25 KHz. Here, 1 UI represents a frequency discrepancy corresponding to one clock cycle (one piece of data) of the input data signal.

However in practice, jitter tolerance of for example greater than or equal to 3 UIp-p may be required, exceeding the range of this regulation.

With the clock signal reproduction device of this example, the digital frequency synchronization-OUT detecting circuit 11 detects whether each rising edge of the eighth division signal 8a, the eighth division signal 8b and the eighth division signal 8a* is located in the high level half period of the reference clock signal b, and by comparing the detection result with the truth table showing preset combinations of detection results, detects out of synchronization conditions. Consequently, it is possible to detect out of synchronization conditions corresponding to a wide range of jitter tolerance as described above.

FIG. 24 through FIG. 27 show an example of the operation of out of frequency synchronization detection according to this embodiment, which is an example of the operation of out of synchronization detection in the case where the frequency of the input data signal increases gradually immediately after switching to phase comparison mode.

FIG. 24 shows the condition immediately after the mode switching signal 13a changes from low level to high level at the rising edge detecting signal 10a, switching to the clock recovery system and setting the phase comparison mode. In this case the rising edge of the eighth division signal 8b is located almost at the center of the high level of the reference clock signal b, and the detected results of the rising edges of the eighth division signal 8a, the eighth division signal 8b and the eighth division signal 8a* are H, H, L respectively, and the digital frequency synchronization-OUT detecting circuit 11 does not generate the detection signal 11a.

In FIG. 25, because of the jitter of the input data signal a, the rising edge of the eighth division signal 8b is outside of the high level range of the reference clock signal b, the rising edge of the eighth division signal 8a is located almost in the center of the high level of the reference clock signal b, and the detected results of the rising edges of the eighth division signal 8a, the eighth division signal 8b and the eighth division signal 8a* are H, L, L respectively. However, the digital frequency synchronization-OUT detecting circuit 11 does not generate the detection signal 11a yet.

FIG. 26 shows a case where the frequency change is further increased. The detected results of the rising edges of the eighth division signal 8a, the eighth division signal 8b and the eighth division signal 8a* are H, L, H respectively, and as a result the digital frequency synchronization-OUT detecting circuit 11 generates the detection signal 11a. Consequently, the mode switching signal 13a changes from high level to low level, switching to the multiplication PLL system, and the phase frequency comparison mode is set.

FIG. 27 shows the greatest frequency discrepancy that can occur in the output clock signal c during the period of the phase comparison mode, where the mode switching signal 13a is at high level, in the case where the frequency of the input data signal is gradually increased. As shown in the figure, the greatest frequency discrepancy within the period of the phase comparison mode is 3.5 UI.

FIG. 28 through FIG. 31 show other examples of the operation of out of frequency synchronization detection according to this embodiment, showing examples of the operation of out of synchronization detection in the case where the frequency of the input data signal is gradually reduced immediately after switching to phase comparison mode.

FIG. 28 shows the condition immediately after the mode switching signal 13a changes from low level to high level at the rising edge detecting signal 10a, switching to the clock recovery system and setting the phase comparison mode. In this case, the rising edge of the eighth division signal 8b is located almost at the center of the high level of the reference clock signal b, and the detected results of the rising edges of the eighth division signal 8a, the eighth division signal 8b and the eighth division signal 8a* are H, H, L respectively, and the digital frequency synchronization-OUT detecting circuit 11 does not generate the detection signal 11a.

In FIG. 29, because of the jitter of the input data signal a, the rising edge of the eighth division signal 8b is outside of the high level range of the reference clock signal b, the rising edge of the eighth division signal 8a* is located almost in the center of the high level of the reference clock signal b, and the detected results of the rising edges of the eighth division signal 8a, the eighth division signal 8b and the eighth division signal 8a* are L, L, H respectively. However, the digital frequency synchronization-OUT detecting circuit 11 does not generate the detection signal 11a yet. FIG. 30 shows a case where the frequency change is further increased, the detection results of the rising edges of the eighth division signal 8a, the eighth division signal 8b and the eighth division signal 8a* are L, L, L respectively, and as a result the digital frequency synchronization-OUT detecting circuit 11 generates the detection signal 11a, and the rising edge detecting signal 12a becomes low level. Consequently, the mode switching signal 13a changes from high level to low level, switching to the multiplication PLL system, and the phase frequency comparison mode is set.

FIG. 31 shows the greatest frequency discrepancy that can occur in the output clock signal c during the period of the phase comparison mode, where the mode switching signal 13a is at high level, in the case where the frequency of the input data signal is gradually decreased. As shown in the figure, the greatest frequency discrepancy within the period of the phase comparison mode is 3.5 UI.

FIG. 32 shows the greatest frequency discrepancy that can occur in the output clock signal c during the period of the phase comparison mode, where the mode switching signal 13a is at a high level, in the case where the frequency of the input data signal is gradually increased after the frequency of the input data signal is gradually reduced such that there is a condition where there is no frequency discrepancy for a time. As shown in the figure, the greatest frequency discrepancy within the period of the phase comparison mode is 4.5 UI.

In this manner with the clock signal reproduction device of this example, since the control signal at the time of clock recovery operation and the control signal at the time of multiplication PLL operation are switched alternately to the input to the VCO 7, there is no possibility of unnecessary errors occurring as in the case where an analog adder is used. Furthermore, since the out of synchronization detection is performed by phase comparison, the time that is required to detect out of synchronization conditions is short. Moreover, synchronization establishment is performed by detection of phase difference, and hence it is possible to detect the establishment of synchronization rapidly.

Furthermore, since the range of phase difference, being the object of out of synchronization detection is wide, clock recovery operation can be maintained for a considerable range of change in the input data signal frequency, and hence it is possible to respond to the need for a wide jitter tolerance range.

Moreover, frequency comparison and judgment of whether the system is in a frequency synchronization condition or in an out of synchronization condition are performed at a low frequency, so that the operations can be performed accurately, and also low power consumption can be achieved.

In the above, embodiments of this invention have been described in detail with reference to the figures. However, the specific construction is not limited to these embodiments, and design changes and the like, within a scope that does not depart from the gist of this invention, are also included in this invention. For example, the division ratio of the frequency divider 8 is not limited to eighth divisions. It is possible to set nth divisions arbitrarily where n is an integer. In this case, when the division ratio is high, the range of jitter tolerance that can be accepted can be wide, and when the division ratio is set low, the range of jitter tolerance that can be accepted becomes narrow. Furthermore, the reference clock signal b, being the reference signal of the eighth division signal 8a, is supplied by a crystal oscillator circuit corresponding to the base frequency of the input data signal. However, if the frequency is sufficiently stable compared with the input data signal, the arrangement may be such that it is supplied by other types of oscillator circuit. Moreover, in the clock signal reproduction device of this example as shown in FIG. 1, in the case where the charge pump circuit 3 and the charge pump circuit 4 have the same structure, it is possible to change the location of the mode switching selector 5 and combine the two charge pump circuits into one for cost saving.

As described above, with the clock signal reproduction device of this invention, frequency synchronization is detected strictly by analog methods using the phase/frequency comparator and the analog frequency synchronization-IN detecting circuit, and hence the frequency synchronization is performed with high accuracy and reliability. On the other hand, out of frequency synchronization is detected gradually by digital methods using the digital frequency synchronization-OUT detecting circuit, and hence the detection cannot be performed until a comparatively large difference of frequency (for example about several 100 ppm) occurs.

Therefore, synchronization can be achieved to the frequency of the input data signal reliably with the clock recovery system. Moreover during the operation in phase comparison mode, even if the frequency of the input data signal varies in a wide range, following it reliably and with a margin is possible. Therefore the need for a wide jitter tolerance range can be satisfied. Furthermore, in the case of being out of frequency synchronization, this is detected and the multiplication PLL system operates, so that frequency synchronization is recovered, and it is possible to return to operation of the clock recovery system rapidly.

What is claimed is:

1. A clock signal reproduction device provided with:
   an oscillation device for generating a clock signal at a frequency corresponding to a control signal input;
   a first comparison device for comparing the phases of an input data signal and said clock signal, and generating a first control signal for correcting a phase difference between said input data signal and said clock signal;
   a second comparison device for comparing the phases of a signal divided from said clock signal and a reference signal, and generating a second control signal for correcting a frequency discrepancy of said clock signal;
   a switching device for selecting either said first control signal or second control signal, and outputting a control signal for applying to said oscillation device; and
   a control device for controlling such that said switching device selects said first control signal depending on a detection signal from a first detecting device for detecting by use of analog methods whether a phase difference between the signal divided from said clock signal and said reference signal is within a first predetermined range, and also for controlling such that said switching device selects said second control signal depending on a detection signal from a second detecting device for detecting by use of digital methods whether a phase difference between the signal divided from said clock signal and said reference signal is outside of a second predetermined range that is wider than said first predetermined range.

2. A clock signal reproduction device according to claim 1, wherein said second detecting device generates said detection signal when it is determined that a condition of edges existing in a plurality of signals that are divided from said clock signal, each having phases differing in half periods of said reference signal, is not in a predetermined condition.

3. A clock signal reproduction device according to claim 2, wherein the plurality of signals with different phases in said second detecting device, which are divided from said clock signal, comprise signals divided from said clock signal, one of which is a signal divided from said clock signal whose phase is shifted by 90 degrees, and another is a signal divided from said clock signal whose phase is shifted by 180 degrees.

4. A clock signal reproduction device according to claim 1, wherein the signals divided from said clock signal are signals dividing said clock signal by n.

5. A clock signal reproduction device according to claim 1, wherein said first detecting device is provided with multistage counting device for counting said reference signal, and latching device that sets when said counting device finishes counting, and resets when the phase difference between a signal divided from said clock signal and said reference signal is within a predetermined range, and generates said detection signal in response to the output conditions at the time that said latching device is reset.

6. A clock signal reproduction device according to claim 1, wherein said oscillation device incorporates filtering device for removing high frequency components of said control signal input, and voltage controlled oscillation device for generating a clock signal at a frequency depending on the output voltage of said filtering device.

7. A clock signal reproduction device according to claim 1, wherein said first detecting device comprises an analog circuit, and said second detecting device comprises a digital circuit.

* * * * *